(12) United States Patent
Guo et al.

(10) Patent No.: US 11,450,838 B2
(45) Date of Patent: Sep. 20, 2022

(54) DISPLAY PANEL, MANUFACTURING METHOD THEREOF AND DISPLAY DEVICE

(71) Applicant: Hubei Yangtze Industrial Innovation Center Of Advanced Display Co., Ltd., Wuhan (CN)

(72) Inventors: Linshan Guo, Wuhan (CN); Shaorong Yu, Shanghai (CN)

(73) Assignee: Hubei Yangtze industrial Innovation Center Of Advanced Display Co., Ltd., Wuhan (CN)

( * ) Notice: Subject to any disclaimer, the term of this patent is extended or adjusted under 35 U.S.C. 154(b) by 160 days.

(21) Appl. No.: 17/122,522

(22) Filed: Dec. 15, 2020

(65) Prior Publication Data

US 2021/0098746 A1    Apr. 1, 2021

(30) Foreign Application Priority Data

Jun. 30, 2020  (CN) .......................... 202010620890.1

(51) Int. Cl.
*H01L 27/32* (2006.01)
*H01L 51/52* (2006.01)
*G02B 5/30* (2006.01)
*H01L 51/56* (2006.01)

(52) U.S. Cl.
CPC ........ *H01L 51/5293* (2013.01); *G02B 5/3025* (2013.01); *H01L 27/3206* (2013.01); *H01L 51/5275* (2013.01); *H01L 51/56* (2013.01)

(58) Field of Classification Search
CPC ..... H01L 27/32; H01L 27/3211; H01L 27/322
See application file for complete search history.

(56) References Cited

U.S. PATENT DOCUMENTS

| 2009/0091238 A1* | 4/2009 | Cok ..................... H01L 51/5265 313/498 |
| 2021/0063811 A1* | 3/2021 | Wang .................. H01L 27/3272 |
| 2021/0157142 A1* | 5/2021 | Scheller ................. H01L 24/08 |

FOREIGN PATENT DOCUMENTS

| CN | 104659075 A | 5/2015 |
| CN | 109216581 A | 1/2019 |
| CN | 110034167 A | 7/2019 |
| CN | 110429126 A | 11/2019 |
| CN | 110764169 A | 2/2020 |

OTHER PUBLICATIONS

Chinese Office Action related to Application No. 202010620890.1 dated May 6, 2022.

* cited by examiner

*Primary Examiner* — Jae Lee
(74) *Attorney, Agent, or Firm* — von Briesen & Roper, s.c.

(57) ABSTRACT

Provided are a display panel, a manufacturing method thereof and a display device. The display panel includes a substrate, multiple light-emitting elements and a circular polarizer. The multiple light-emitting elements are disposed on one side of the substrate. The circular polarizer is disposed on one side of the multiple light-emitting elements facing away from the substrate. The circular polarizer is provided with first hollow structures corresponding to at least part of the multiple light-emitting elements. The area where each first hollow structure is located overlaps a respective one of the at least part of the multiple light-emitting elements.

20 Claims, 19 Drawing Sheets

DISPLAY PANEL, MANUFACTURING METHOD THEREOF AND DISPLAY DEVICE

CROSS-REFERENCES TO RELATED APPLICATIONS

This application claims priority to a Chinese patent application No. CN202010620890.1 filed at the CNIPA on Jun. 30, 2020, the disclosure of which is incorporated herein by reference in its entirety.

TECHNICAL FIELD

Embodiments of the present disclosure relate to the field of display technologies and, in particular, to a display panel, a manufacturing method thereof and a display device.

BACKGROUND

An organic light-emitting display panel has the advantages of self-luminescence, no backlight, low power consumption and high brightness. Therefore, the organic light-emitting display panel is widely used in various electronic devices and is favored by the user.

The organic light-emitting display panel includes multiple metal structures inside. The multiple metal structures may emit light indoors or in strong external light. The emitted light interferes with the display screen and causes a worse visual experience for the user. To solve the preceding problem, the size of a black matrix layer with a certain reflection reduction effect needs to be increased. However, the increase in the size of the black matrix layer results in the reduction of the area of a pixel opening area and the viewing angle of the display panel. It can be seen that the structure of a conventional organic light-emitting display panel cannot satisfy the requirements for both reflection reduction and a large viewing angle.

SUMMARY

The present disclosure provides a display panel, a manufacturing method thereof and a display device so that the requirements for both reflection reduction and a large viewing angle of the display panel are satisfied.

In a first aspect, embodiments of the present disclosure provide a display panel. The display panel includes a substrate, multiple light-emitting elements and a circular polarizer. The multiple light-emitting elements are disposed on one side of the substrate. The circular polarizer is disposed on one side of the multiple light-emitting elements facing away from the substrate. The circular polarizer is provided with first hollow structures corresponding to at least part of the multiple light-emitting elements. The area where each first hollow structure is located overlaps a respective one of the at least part of the multiple light-emitting elements.

In a second aspect, embodiments of the present disclosure further provide a display device including the display panel described in the first aspect.

In a third aspect, embodiments of the present disclosure further provide a manufacturing method of a display panel. The method includes the steps described blow.

A substrate is provided.

Multiple light-emitting elements are formed on the substrate.

A circular polarizer is attached to one side of the multiple light-emitting elements facing away from the substrate. The circular polarizer is provided with first hollow structures corresponding to at least part of the multiple light-emitting elements. The area where each first hollow structure is located overlaps a respective one of the at least part of the multiple light-emitting elements.

BRIEF DESCRIPTION OF DRAWINGS

Other features, objects and advantages of the present disclosure will become more apparent from a detailed description of non-restrictive embodiments with reference to the drawings.

DETAILED DESCRIPTION

Figure 1:
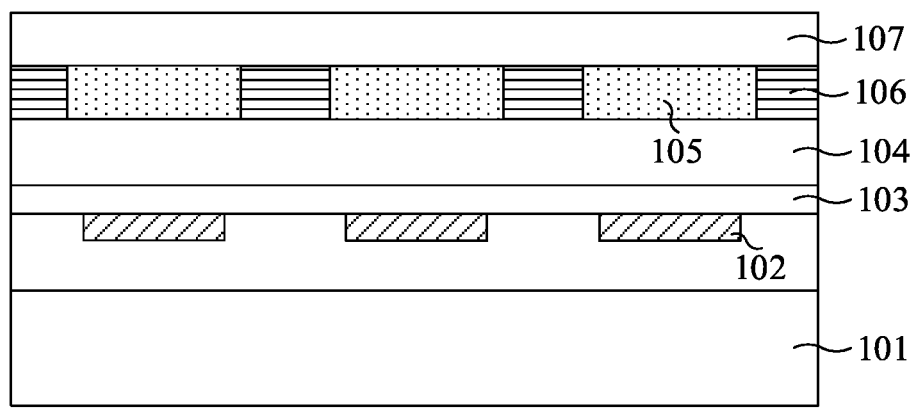
FIG. 1 is a structural view of a display panel in the related art.

To elucidate technical means and technical effects for achieving an intended purpose of the present disclosure, implementations, structures, features and effects of a display panel, a manufacturing method thereof and a display device according to the present disclosure are described hereinafter in detail with reference to the drawings and preferred embodiments.

Embodiments of the present disclosure provide a display panel. The display panel includes a substrate, multiple light-emitting elements and a circular polarizer. The multiple light-emitting elements are disposed on one side of the substrate. The circular polarizer is disposed on one side of the multiple light-emitting elements facing away from the substrate. The circular polarizer is provided with first hollow structures corresponding to at least part of the multiple light-emitting elements. The area where each first hollow structure is located overlaps a respective one of the at least part of the multiple light-emitting elements.

In the solution provided in embodiments of the present disclosure, a circular polarizer is disposed on one side of multiple light-emitting elements facing away from a substrate, the circular polarizer is provided with first hollow structures corresponding to at least part of the multiple light-emitting elements, and the area where each first hollow structure is located overlaps a respective one of the at least part of the multiple light-emitting elements. In this manner, while the size of the first hollow structures is increased to satisfy the requirement for a large viewing angle, the circular polarizer with an excellent reflection reduction effect in the remaining area can still effectively reduce the reflectivity of the display panel to external light. Therefore, the requirements for both reflection reduction and a large viewing angle are satisfied.

The preceding is the core idea of this application, and solutions in embodiments of the present disclosure will be described clearly and completely in conjunction with the drawings in embodiments of the present disclosure. Apparently, the embodiments described below are part, not all, of embodiments of the present disclosure. Based on embodiments of the present disclosure, all other embodiments obtained by those skilled in the art without creative work are within the scope of the present disclosure.

Details are set forth below to facilitate a thorough understanding of the present disclosure. However, the present disclosure may be implemented by other embodiments different from the embodiments described herein, and those skilled in the art may make similar generalizations without departing from the spirit of the present disclosure. Therefore, the disclosure is not limited to the embodiments described below.

In addition, the present disclosure will be described in detail in conjunction with the drawings. In detailed description of embodiments of the present disclosure, for ease of description, schematic views illustrating structures of devices and components are not partially enlarged in accordance with a general proportional scale. The schematic views are merely illustrative and are not intended to limit the scope of the present disclosure. In addition, three-dimensional spatial sizes: length, width and height are included in actual manufacturing.

FIG. 1 is a structural view of a display panel in the related art. As shown in FIG. 1, the display panel includes a substrate 101, and multiple light-emitting elements 102, a thin-film encapsulation layer 103, a touch layer 104, multiple color resistance blocks 105, a black matrix layer 106 and a cover plate 107 which are sequentially stacked on the substrate 101. Each color resistance block 105 corresponds to a respective light-emitting element 102. Each color resistance block 105 covers the respective light-emitting element 102. The black matrix layer 106 has a light shielding function. To satisfy the requirement for a large viewing angle, it is required to increase the size of the multiple color resistance blocks 105 and correspondingly reduce the size of the black matrix layer 106. On the other hand, the black matrix layer 106 has a reflection reduction function. To reduce the specular reflection of the display panel to external light, it is required to increase the size of the black matrix layer 106. It can be seen that the black matrix layer 106 cannot satisfy the requirements for both a large viewing angle and reflection reduction of the display panel.

To solve the preceding problem, embodiments of the present disclosure provide a display panel. In the display panel, the black matrix layer in the related art is replaced with a circular polarizer with a better reflection reduction effect than the black matrix layer so that the requirements for both a large viewing angle and reflection reduction of the display panel are satisfied.

Figure 2:
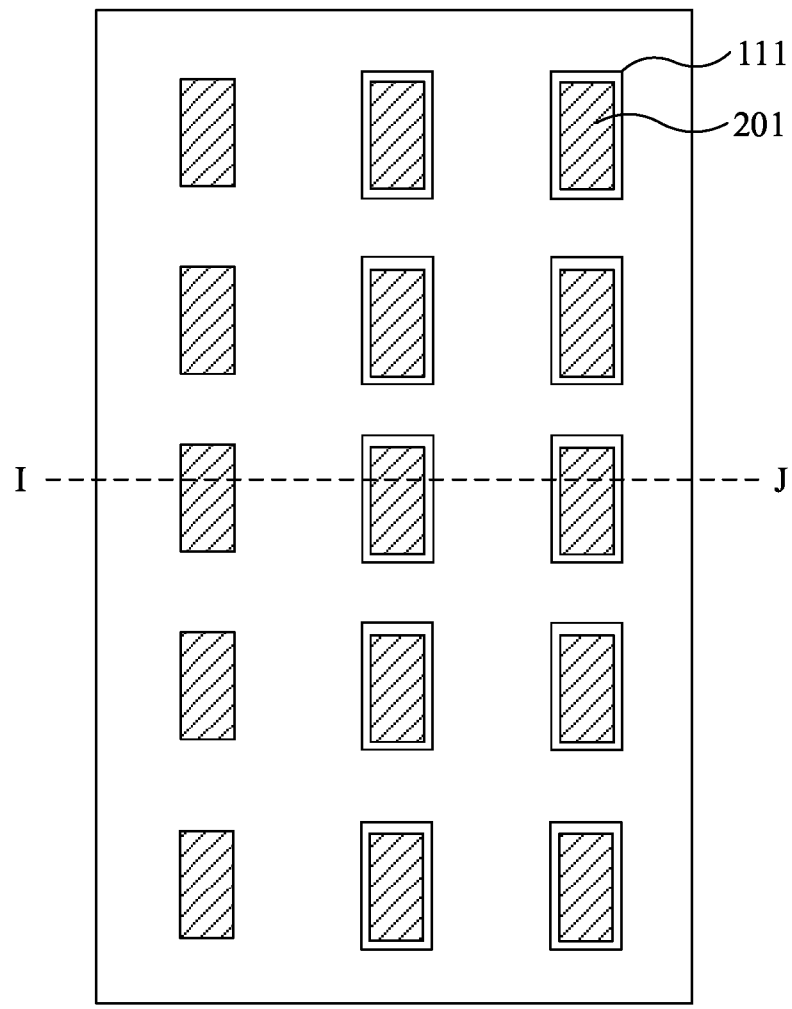
FIG. 2 is a top view of a display panel according to an embodiment of the present disclosure.
Figure 3:
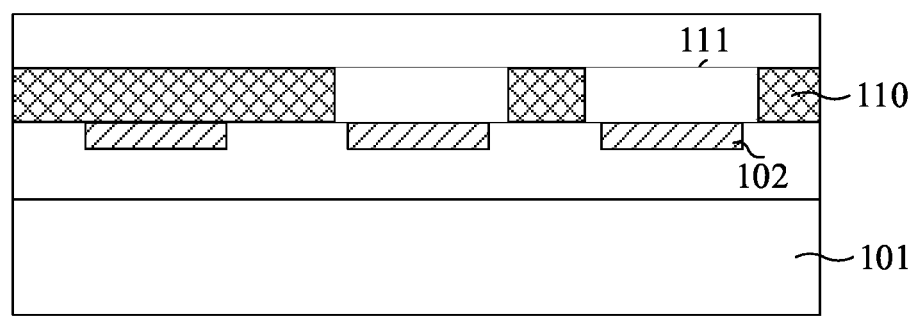
FIG. 3 is a cross-sectional view taken along the dashed line IJ of FIG. 2.

Specifically, FIG. 2 is a top view of a display panel according to an embodiment of the present disclosure. FIG. 3 is a cross-sectional view taken along the dashed line IJ of FIG. 2. As shown in FIG. 2 and FIG. 3, the display panel includes a substrate 101, multiple light-emitting elements 102 and a circular polarizer 110. The multiple light-emitting elements 102 are disposed on one side of the substrate 101. The circular polarizer 110 is disposed on one side of the multiple light-emitting elements 102 facing away from the substrate 101. The circular polarizer is provided with first hollow structures 111 corresponding to at least part of the multiple light-emitting elements 102. The area where each first hollow structure 111 is located overlaps a respective one of the at least part of the multiple light-emitting elements 102.

Figure 4:
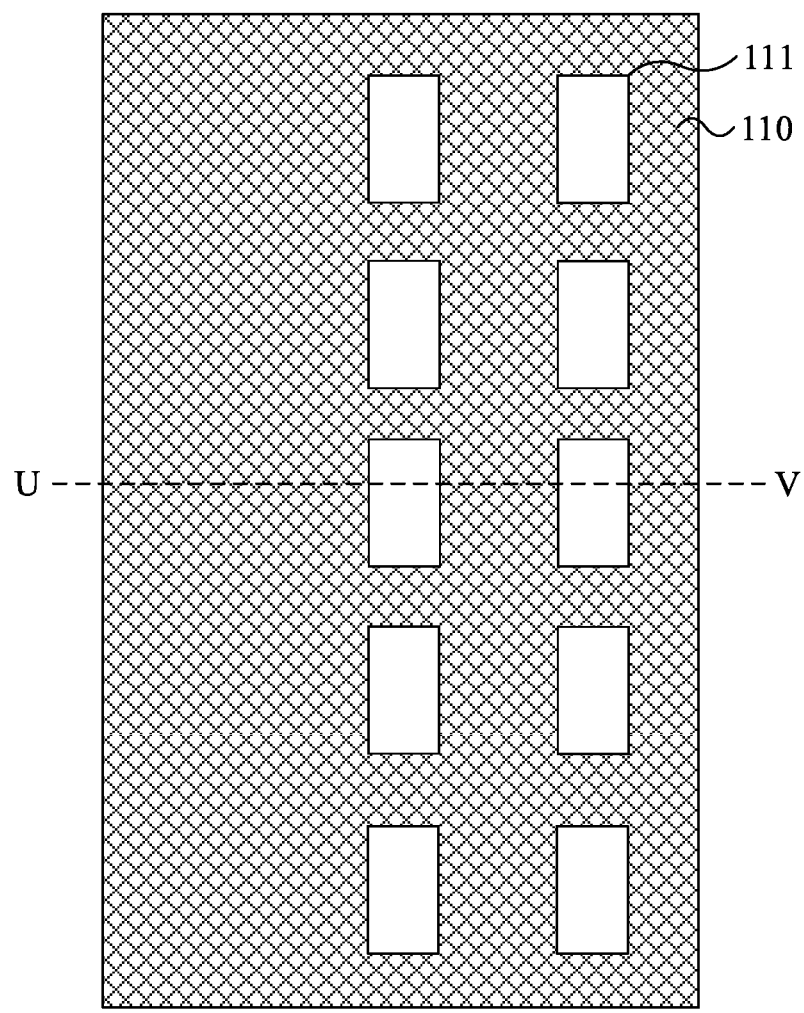
FIG. 4 is a top view of a circular polarizer according to an embodiment of the present disclosure.
Figure 5:
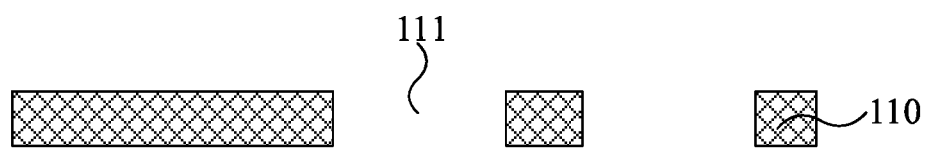
FIG. 5 is a cross-sectional view taken along the dashed line UV of FIG. 4.

Specifically, FIG. 4 is a top view of a circular polarizer according to an embodiment of the present disclosure. FIG. 5 is a cross-sectional view taken along the dashed line UV of FIG. 4. As shown in FIG. 4 and FIG. 5, the circular polarizer 110 includes multiple hollow structures 111. Each hollow structure 111 is obtained in such manner that the part in a respective area of the circular polarizer 110 is removed.

It is to be noted that the circular polarizer 110 is formed in such manner that a linear polarizer is adhered to a quarter wave plate. In this manner, after ambient light incident from the outside passes through the linear polarizer and passes through the quarter wave plate twice, the ambient light becomes a reflected light perpendicular to the polarization direction of the linear polarizer so that the reflected light is blocked by the linear polarizer, and thus the problem of specular reflection of the display panel is solved.

In addition, the circular polarizer 110 also has a certain ability to block the light emitted by the multiple light-emitting elements 102. For example, the linear polarizer in the circular polarizer can reduce the brightness of the light emitted by the multiple light-emitting elements by about half. The disposed first hollow structures may improve the light-emitting efficiency of the respective light-emitting elements 102.

In the solution provided in this embodiment, a circular polarizer 110 is disposed on one side of multiple light-emitting elements 102 facing away from a substrate 101, the circular polarizer 110 is provided with first hollow structures 111 corresponding to at least part of the multiple light-emitting elements 102, and the area where each first hollow structure 111 is located overlaps a respective one of the at least part of the multiple light-emitting elements 102. In this manner, while the size of the first hollow structures 111 is increased to satisfy the requirement for a large viewing angle, the circular polarizer 110 with an excellent reflection reduction effect in the remaining area can still effectively reduce the reflectivity of the display panel to external light. Therefore, the requirements for both reflection reduction and a large viewing angle are satisfied.

Figure 6:
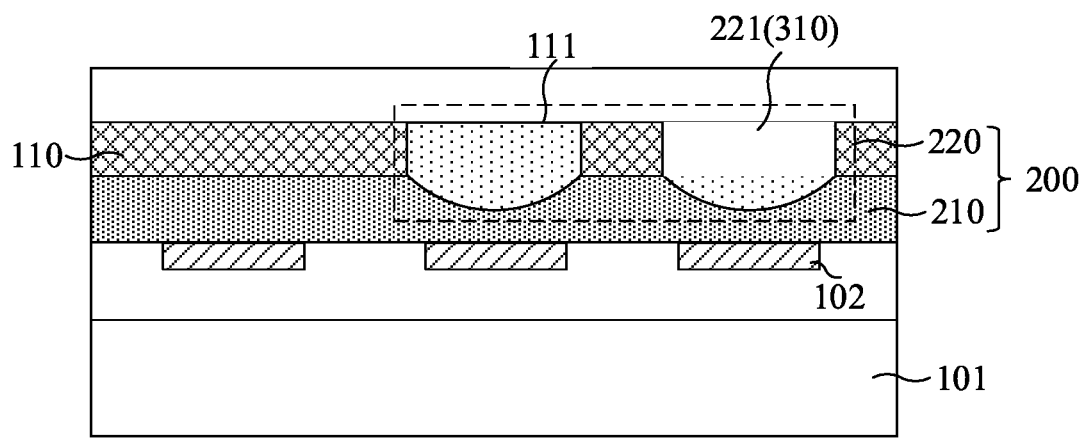
FIG. 6 is a structural view of another display panel according to an embodiment of the present disclosure.

FIG. 6 is a structural view of another display panel according to an embodiment of the present disclosure. As shown in FIG. 6, the display panel further includes a microlens structure layer 200 disposed on the side of the multiple light-emitting elements 102 facing away from the substrate 101. The microlens structure layer 200 includes a first light adjusting layer 210 and a second light adjusting layer 220. The first light adjusting layer 210 is disposed on one side of the second light adjusting layer 220 facing towards the substrate. The refractivity of the first light adjusting layer 210 is less than the refractivity of the second light adjusting layer 220. The first light adjusting layer 210 is disposed between the circular polarizer 110 and the multiple light-emitting elements 102.

It is to be noted that light is refracted at the contact interface of two materials with different refractivities, and thus the propagation direction changes. The disposed microlens structure layer 200 can adjust the propagation direction of the light emitted by the multiple light-emitting elements 102 and reduce the light that is totally reflected at the interface of adjacent films so that the light-emitting efficiency of the display panel is improved.

It is to be further noted that the light emitted by the multiple light-emitting elements 102 enters the second light adjusting layer 220 after passing through the first light adjusting layer 210. The refractivity of the second light adjusting layer 220 is configured to be greater than the refractivity of the first light adjusting layer 210 so that the light emitted by the multiple light-emitting elements can be prevented from being totally reflected at the interface between the two films.

By way of example, one of the first light adjusting layer 210 and the second light adjusting layer 220 is a microlens layer, and the other of the first light adjusting layer 210 and the second light adjusting layer 220 is an optical adhesive layer. The microlens layer includes multiple microlenses. For example, as shown in FIG. 6, the second light adjusting layer 220 is the microlens layer including the multiple microlenses 221, and the first light adjusting layer 210 is the optical adhesive layer. The material of the optical adhesive layer may be a low-refractivity material such as ultraviolet curing adhesive, one-component epoxy adhesive, organic silica gel, high-strength AB adhesive or polyurethane adhesive.

It is to be noted that in this disposition, a specific shape of the contact surface between the first light adjusting layer 210 and the second light adjusting layer 220 is formed. The shape of the contact surface may be, for example, a convex toward one side facing towards the multiple light-emitting elements 102 or a convex toward one side facing away from the multiple light-emitting elements 102. In this manner, the propagation direction of the light emitted by the multiple light-emitting elements 102 can be adjusted, the amount of light that is totally reflected at the interface of adjacent films can be reduced, and the light-emitting efficiency of the display panel can be improved. It is to be understood that to enable the propagation direction of light to be adjusted, the microlens 221 and the optical adhesive layer are disposed in contact with and adjacent to each other, and the shape of the microlens 221 and the shape of the optical adhesive layer fit together. For example, the microlens 221 is convex toward one side of the optical adhesive layer, and the corresponding surface of the optical adhesive layer is concave toward one side facing away from the microlens 221. Specifically, during the preparation process of the display panel, after one of the microlens 221 or the optical adhesive layer is formed, the other of the microlens 221 or the optical adhesive layer is contacted, in a fluid state, with the former one of the microlens 221 or the optical adhesive layer and then cured. In this manner, the microlens 221 and the optical adhesive layer are in close contact and the shape of the microlens 221 and the shape of the optical adhesive layer fit together.

Optionally, still referring to FIG. 6, the second light adjusting layer 220 includes the multiple microlenses 221. Each microlens 221 corresponds to a respective first hollow structure 111. Each multiple microlens 221 is embedded in the respective first hollow structure 111.

It is to be noted that this configuration can reduce the overall thickness of the microlens structure layer 200 and the circular polarizer 110 so that the overall thickness of the display panel is reduced, and thus the requirement for thinning of the display panel is satisfied. On the other hand, the multiple microlenses 221 fill the first hollow structures 111 to enhance the strength of and the sealing performance of the areas where the first hollow structures 111 are located, and thus the probability of damage to these areas and the probability that water and oxygen enter these areas are reduced.

By way of example, as shown in FIG. 6, the display panel may further include the multiple color resistance blocks 310. The multiple color resistance blocks 310 are multiplexed as the multiple microlenses 221.

It is to be noted that the multiple color resistance blocks 310 are used for adjusting the color parameters of the light emitted by the multiple light-emitting elements 102 to improve the quality of the display image. The multiple microlenses 221 are used for adjusting the propagation direction of light to improve the light-emitting efficiency of the display panel. The multiple color resistance blocks 310 are multiplexed as the multiple microlenses 221 so that the display panel has both the preceding function of the multiple color resistance blocks 310 and the preceding function of the multiple microlenses 221 while having a smaller number of films. This facilitates the thinning of the display panel.

Figure 7:
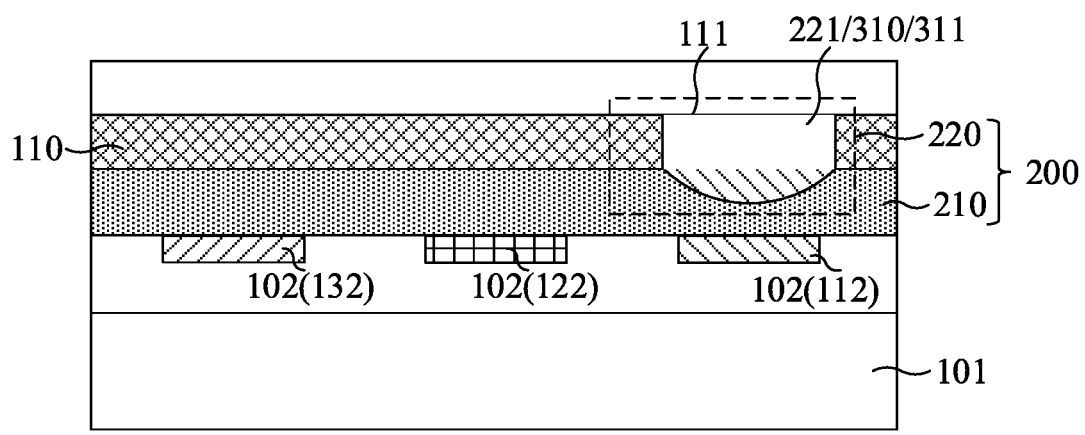
FIG. 7 is a structural view of another display panel according to an embodiment of the present disclosure.

FIG. 7 is a structural view of another display panel according to an embodiment of the present disclosure. As shown in FIG. 7, the display panel further includes the multiple color resistance blocks 310. The multiple color resistance blocks 310 are multiplexed as the multiple microlenses 221. The multiple light-emitting elements 102 include multiple first light-emitting elements 112, multiple second light-emitting elements 122 and multiple third light-emitting elements 132. The color of the multiple first light-emitting elements 112 is blue, the color of the multiple second light-emitting elements 122 is green, and the color of the multiple third light-emitting elements 132 is red. The first hollow structures 111 are disposed in one-to-one correspondence with the multiple first light-emitting elements 112. The multiple color resistance blocks 310 include blue color resistance blocks 311.

It is to be noted that blue light-emitting elements have a short life and low light-emitting efficiency. The circular polarizer 110 is provided with the first hollow structures 111 in one-to-one correspondence with the multiple first light-emitting elements 112, and the blue color resistance blocks 311 fill the first hollow structures 111. In this manner, the blue light emitted by the multiple first light-emitting elements 112 may be directly emitted from the first hollow structures 111, the light-emitting intensity is increased, and thus the driving current or driving voltage required to obtain the same intensity of emitted light is reduced. This facilitates the improvement of the life of the multiple first light-emitting elements 112. On the other hand, the blue color resistance blocks 311 can adjust the color parameters of blue light to improve the quality of the display image.

Figure 8:
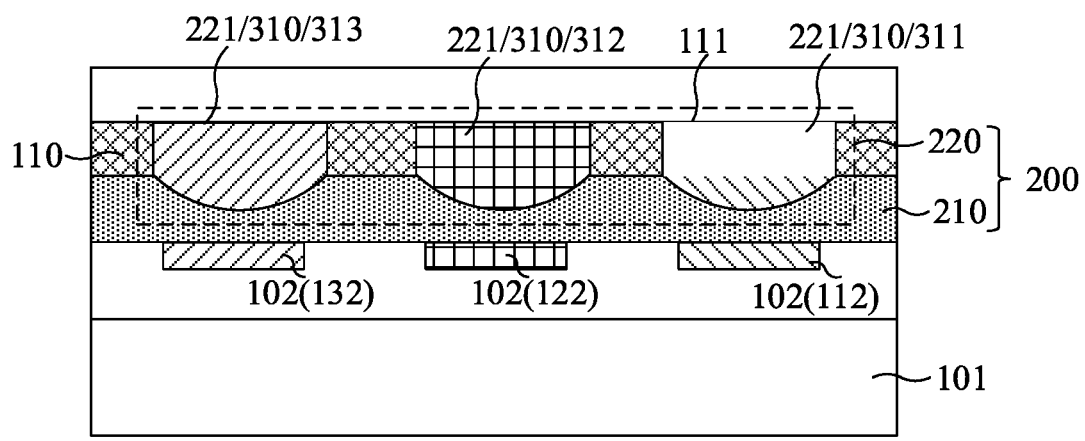
FIG. 8 is a structural view of another display panel according to an embodiment of the present disclosure.

FIG. 8 is a structural view of another display panel according to an embodiment of the present disclosure. As shown in FIG. 8, the display panel further includes the multiple color resistance blocks 310. The multiple color resistance blocks 310 are multiplexed as the multiple microlenses 221. The multiple light-emitting elements 102 include the multiple first light-emitting elements 112, the multiple second light-emitting elements 122 and the multiple third light-emitting elements 132. The color of the multiple first light-emitting elements 112 is blue, the color of the multiple second light-emitting elements 122 is green, and the color of the multiple third light-emitting elements 132 is red. The first hollow structures 111 are disposed in one-to-one correspondence with the multiple first light-emitting elements 112, the multiple second light-emitting elements 122 and the multiple third light-emitting elements 132. The multiple color resistance blocks 310 include blue color resistance blocks 311 disposed in one-to-one correspondence with the multiple first light-emitting elements 112, green color resistance blocks 312 disposed in one-to-one correspondence with the multiple second light-emitting elements 122 and red color resistance blocks 313 disposed in one-to-one correspondence with the multiple third light-emitting elements 132.

It is to be noted that this disposition enables the blue light emitted by the multiple first light-emitting elements 112, the green light emitted by the multiple second light-emitting elements 122 and the red light emitted by the multiple third light-emitting elements 132 to be directly emitted through the respective first hollow structures 111. In this manner, the following problem is solved: The circular polarizer 110 blocks the light to reduce the light-emitting efficiency of the multiple light-emitting elements 102; and the beneficial effect is achieved: The light-emitting efficiency of the display panel is improved. Meanwhile, the blue color resistance blocks 311 may adjust the color parameters of the blue light emitted by the multiple first light-emitting elements, the green color resistance blocks 312 may adjust the color parameters of the green light emitted by the multiple second light-emitting elements 122, and the red color resistance blocks 313 may adjust the color parameters of the red light emitted by the multiple third light-emitting elements.

Figure 9:
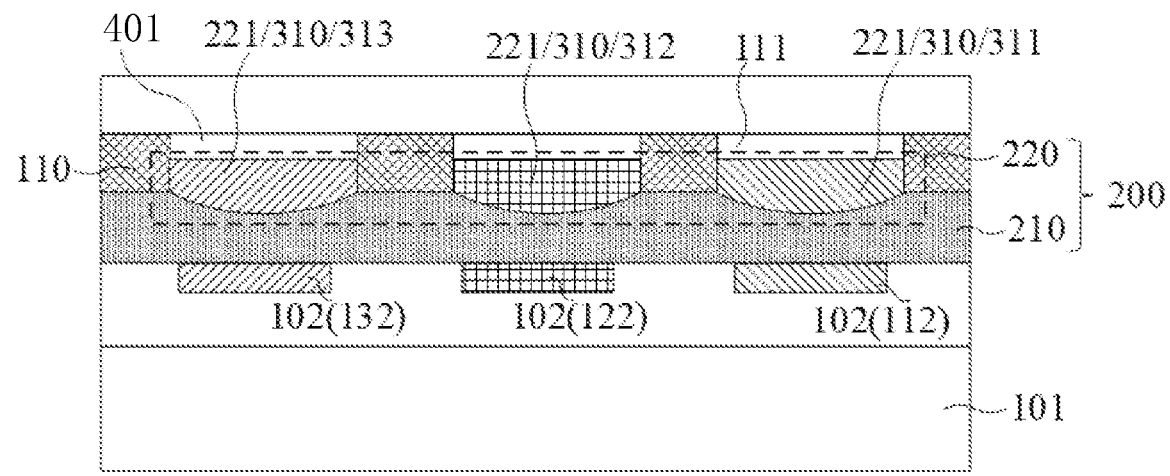
FIG. 9 is a structural view of another display panel according to an embodiment of the present disclosure.

FIG. 9 is a structural view of another display panel according to an embodiment of the present disclosure. As shown in FIG. 9, the display panel includes the multiple color resistance blocks 310. The multiple color resistance blocks 310 are multiplexed as the multiple microlenses 221. The display panel further includes multiple first optical adhesive blocks 401. Each first optical adhesive block 401 corresponds to a respective color resistance block 310. Each first optical adhesive blocks 401 and the respective color resistance block 310 are embedded in the same first hollow structure 111. Each first optical adhesive block 401 is disposed on one side of the respective color resistance block 310 facing away from the substrate 101.

It is to be noted that the multiple first optical adhesive blocks 401 have a better light transmittance than the multiple color resistance blocks 310. The multiple first optical adhesive blocks 401 are disposed in the first hollow structures 111 and on one side facing away from the multiple color resistance blocks 310 so that it is ensured that the first hollow structures 111 are filled. In this manner, the strength of the circular polarizer 110 and the sealing performance of the areas in the circular polarizer 110 corresponding to the first hollow structures 111 are enhanced; and while the multiple color resistance blocks 310 effectively adjust the color parameters of the light emitted by the multiple light-emitting elements 102, the light transmittance of the internal structure of the first hollow structures 111 is increased so that the light-emitting efficiency of light is improved.

Figure 10:
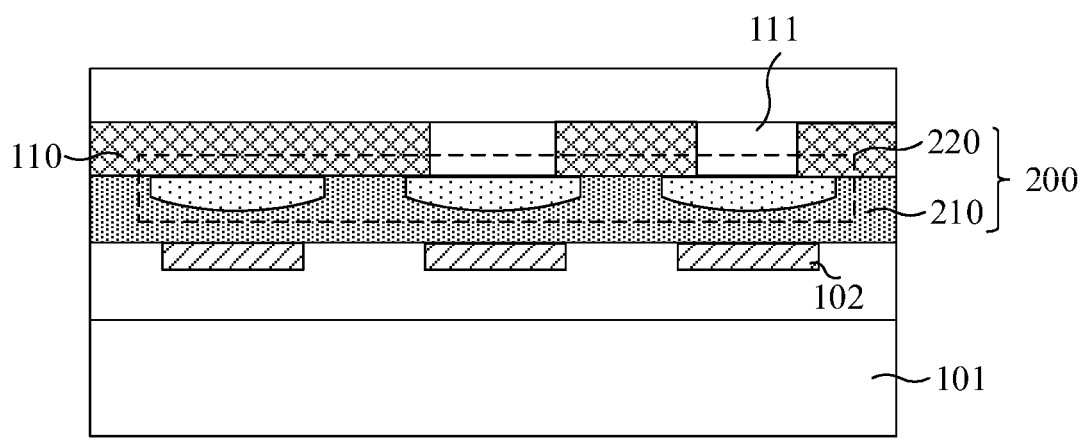
FIG. 10 is a structural view of another display panel according to an embodiment of the present disclosure.

FIG. 10 is a structural view of another display panel according to an embodiment of the present disclosure. As shown in FIG. 10, the display panel further includes a microlens structure layer 200 disposed on the side of the multiple light-emitting elements 102 facing away from the substrate 101. The microlens structure layer 200 includes the first light adjusting layer 210 and the second light adjusting layer 220. The first light adjusting layer 210 is disposed on one side of the second light adjusting layer 220 facing towards the substrate. The refractivity of the first light adjusting layer 210 is less than the refractivity of the second light adjusting layer 220. The first light adjusting layer 210 and the second light adjusting layer 220 are both disposed between the circular polarizer 110 and the multiple light-emitting elements 102.

It is to be understood that a transparent filling layer may be formed inside the first hollow structures 111 to fill the first hollow structures 111 and enhance the strength of and the sealing performance of the circular polarizer 110. Moreover, in the case where the second light adjusting layer 220 is formed on the circular polarizer 110, the transparent filling layer can fill the first hollow structures 111 to provide a flat deposition surface for the second light adjusting layer 220. For example, the material of the transparent filling layer may be optical adhesive.

It is to be noted that in the case where the first light adjusting layer 210 and the second light adjusting layer 220 are both located between the circular polarizer 110 and the multiple light-emitting elements 102, the first light adjusting layer 210 and the second light adjusting layer 220 have a relative great contact area and the propagation direction of light can be adjusted in a more effective manner. In addition, in the case where the first light adjusting layer 210 and the second light adjusting layer 220 are both disposed between the circular polarizer 110 and the multiple light-emitting elements 102, the display panel may be formed in the following manner: With the circular polarizer 110 as a substrate, the second light adjusting layer 220 including the multiple microlenses is formed on the circular polarizer 110, an array substrate including the multiple light-emitting elements 102 is formed, the second light adjusting layer 220 is bonded to the array substrate by using an optical adhesive layer, and then the optical adhesive layer is cured so that the first light adjusting layer 210 is formed. During the manufacturing process of the preceding display panel, the second light adjusting layer 220 is formed on the circular polarizer 110. Conditions such as high temperature used in the manufacturing process do not affect the multiple light-emitting elements 102 so that the second light adjusting layer 220 may be formed in a more flexible process.

Figure 11:
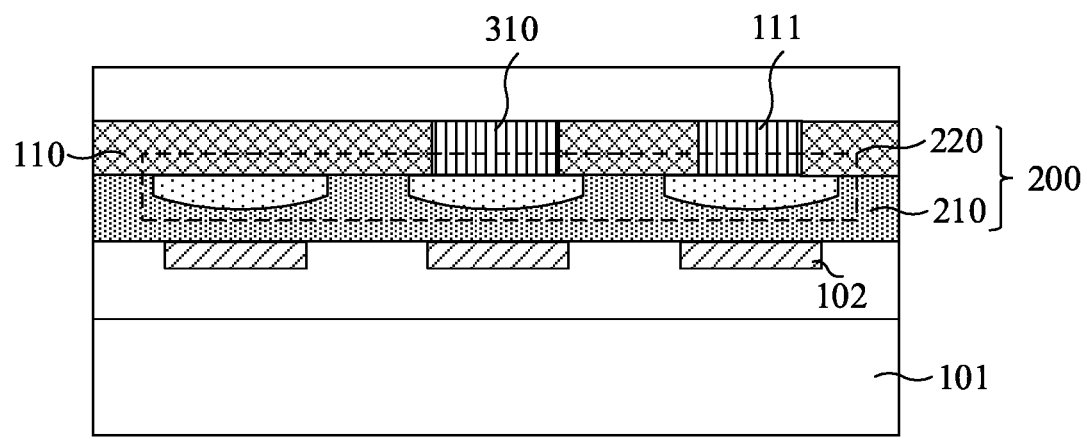
FIG. 11 is a structural view of another display panel according to an embodiment of the present disclosure.

FIG. 11 is a structural view of another display panel according to an embodiment of the present disclosure. As shown in FIG. 11, the display panel further includes the multiple color resistance blocks 310. Each color resistance block 310 corresponds to a respective first hollow structure 111. Each color resistance blocks 310 is embedded in the respective first hollow structure 111.

It is to be noted that the multiple color resistance blocks 310 can fill the first hollow structures 111 to enhance the strength of and the sealing performance of the circular polarizer 110 and provide a flat deposition surface for the solution in which the second light adjusting layer is formed on the circular polarizer 110. In addition, the multiple color resistance blocks 310 can also adjust the color parameters of the light emitted by the multiple light-emitting elements 102 to improve the image quality.

Figure 12:
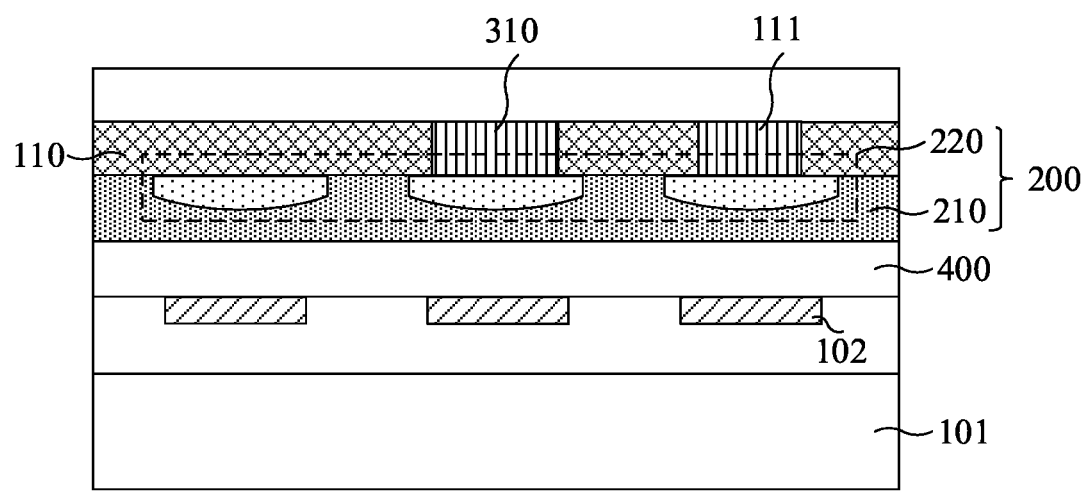
FIG. 12 is a structural view of another display panel according to an embodiment of the present disclosure.

FIG. 12 is a structural view of another display panel according to an embodiment of the present disclosure. As shown in FIG. 12, the display panel further includes a touch layer 400. The touch layer is located between the microlens structure layer 200 and the multiple light-emitting elements 102. The first light adjusting layer 210 is disposed on one side of the touch layer 400 facing away from the substrate 101 and is disposed adjacent to the touch layer 400. The first light adjusting layer 210 may be in contact with the touch layer 400.

It is to be noted that the touch layer 400 is used for implementing touch detection, so as to add a new manner of human-computer interaction for the display panel.

Figure 13:
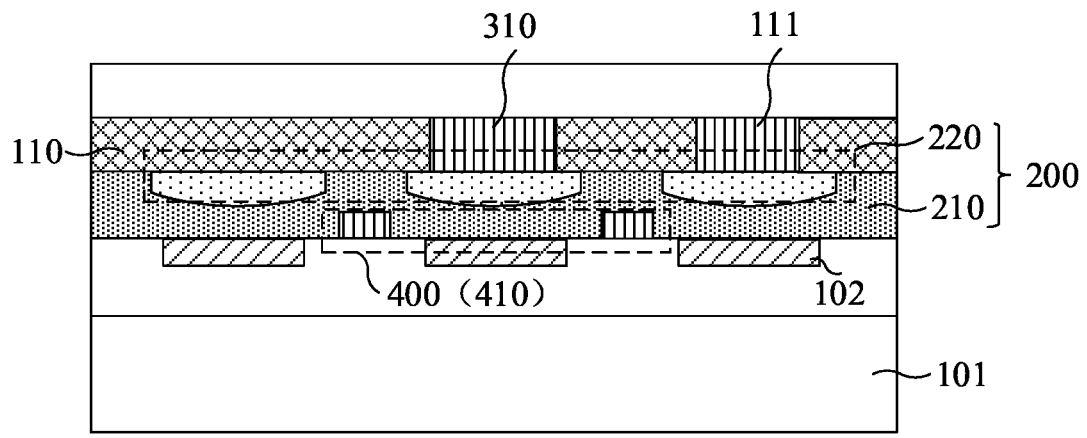
FIG. 13 is a structural view of another display panel according to an embodiment of the present disclosure.

By way of example, FIG. 13 is a structural view of another display panel according to an embodiment of the present disclosure. As shown in FIG. 13, the touch layer 400 includes metal parts 410, and an area of the circular polarizer 110 excluding the first hollow structures 111 covers the metal parts 410.

It is to be noted that the metal parts 410 have a relatively strong light reflectivity. To prevent the metal parts 410 from reflecting external light and thus causing a specular effect, a circular polarizer 110 with a good reflection reduction function is provided to cover the metal parts 410.

The metal parts 410 may be touch electrodes and/or touch signal lines, which is not specifically limited in this embodiment.

Optionally, with continued reference to FIG. 13, the touch layer 400 may include a first metal layer 410, and the first metal layer 410 includes touch electrodes.

By way of example, the touch electrodes may be self-capacitance touch electrodes to form a self-capacitance touch structure. For example, the touch electrodes may be arranged in a matrix. Each self-capacitance touch electrode and the ground form a capacitor. During the touch operation, the finger of an operator is superimposed on this capacitor to increase the capacitance so that the touch operation is implemented by the detection of the capacitance change. The operator does not need to use a relatively large pressing force and may touch the screen lightly by using the finger. The power consumption is relatively low.

While the structure of touch layer 400 can be touched effectively, the structure of this type of touch layer 400 may achieve an effective touch operation and a small overall thickness, which facilitates the thinning of the display panel.

Figure 14:
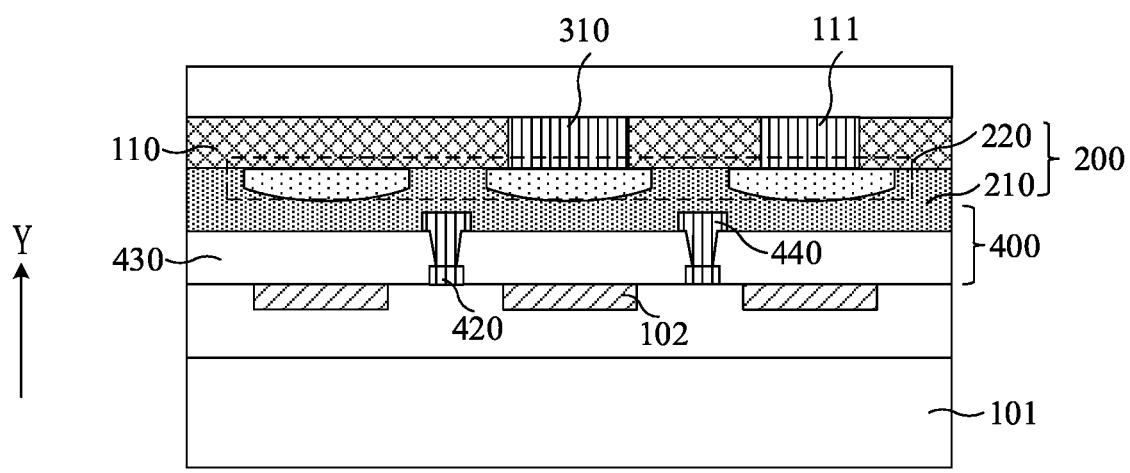
FIG. 14 is a structural view of another display panel according to an embodiment of the present disclosure.

FIG. 14 is a structural view of another display panel according to an embodiment of the present disclosure. Different from FIG. 13, as shown in FIG. 14, the touch layer 400 includes a second metal layer 420, an insulation layer 430 and a third metal layer 440. The second metal layer 420, the insulation layer 430 and the third metal layer 440 are sequentially stacked along a light outgoing direction Y of the multiple light-emitting elements 102.

By way of example, the touch layer 400 may include a mutual capacitance touch structure. Specifically, the second metal layer 420 includes multiple first touch electrodes and multiple second touch electrodes, and the third metal layer 440 includes a metal bridge. The metal bridge is used for electrically connecting two adjacent first touch electrodes, so that the first touch electrodes in the second metal layer 420 are electrically connected to form first electrodes that are extended along a first direction and arranged along a second direction. The second touch electrodes in the second metal layer 420 are electrically connected through the connection portions in the second metal layer 420 form second electrodes, and the second electrodes are extended along the second direction and arranged along the first direction. The second direction intersects the first direction. During the touch operation, the coupling between each first electrode and each second electrode near the touch point is affected so that the capacitance between each first electrode and each second electrode is changed, and thus the touch operation is implemented by the detection of the capacitance change. The mutual capacitance touch structure can achieve multi-point touch operation to enrich the human-computer interaction manners.

For the touch layer 400 including the second metal layer 420, the insulation layer 430 and the third metal layer 440, the disposition of the second metal layer 420 and the third metal layer 440 may further include that the second metal layer 420 includes the multiple first touch electrodes extending along the first direction and arranged along the second direction; the second metal layer 430 includes the multiple second touch electrodes extending along the second direction and arranged along the first direction. The multiple first touch electrodes and the multiple second touch electrodes are insulated from each other by the insulation layer 430; and the multiple first touch electrodes and the multiple second touch electrodes are jointly used in the detection of the touch position.

Figure 15:
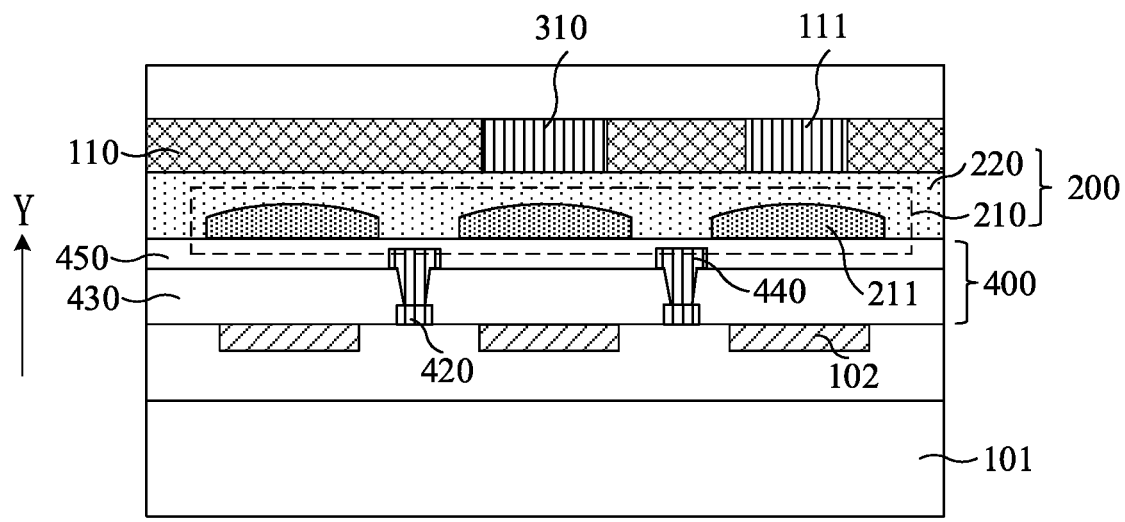
FIG. 15 is a structural view of another display panel according to an embodiment of the present disclosure.

FIG. 15 is a structural view of another display panel according to an embodiment of the present disclosure. As shown in FIG. 15, the touch layer 400 further includes a protective layer 450. The protective layer 450 is disposed adjacent to the first light adjusting layer 210. The first light adjusting layer 210 includes multiple microlenses 211.

It is to be noted that on the one hand, the protective layer 450 provides a flat deposition surface for the formation of the first light adjusting layer 210; on the other hand, the protective layer 450 can protect the touch electrodes in the touch layer 400 from the influence of conditions such as high temperature in the preparation of the first light adjusting layer 210.

It is to be understood that in this embodiment, only the case where the touch layer 400 includes two metal layers is used as an example. For the touch layer 400 including one metal layer shown in FIG. 13, the relevant configurations of the protective layer 450 and the microlens structure layer 200 in FIG. 15 are also applicable, and details are not described here again.

Figure 16:
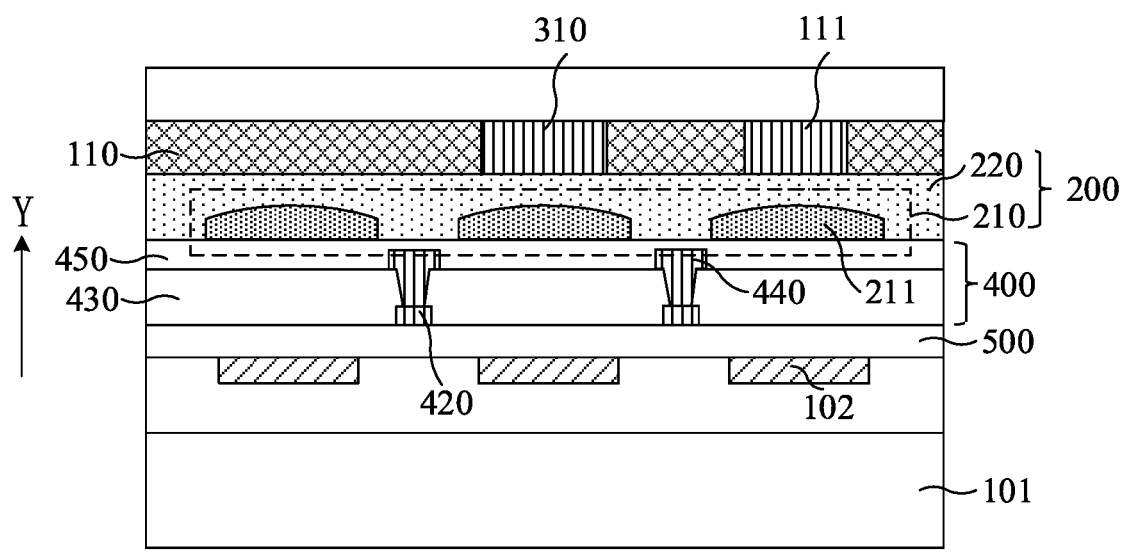
FIG. 16 is a structural view of another display panel according to an embodiment of the present disclosure.

FIG. 16 is a structural view of another display panel according to an embodiment of the present disclosure. As shown in FIG. 16, the display panel further includes a thin-film encapsulation layer 500. The thin-film encapsulation layer 500 is disposed between the multiple light-emitting elements 102 and the touch layer 400 and the multiple light-emitting elements 102 are covered by the thin-film encapsulation layer 500. The thin-film encapsulation layer 500 is disposed adjacent to the touch layer 400.

It is to be noted that the thin-film encapsulation layer 500 is used for encapsulating the multiple light-emitting elements 102 to prevent water and oxygen in the environment from entering the positions of the multiple light-emitting elements 102 to cause the multiple light-emitting elements 102 to fail. The structure of the thin-film encapsulation layer 500 may be, for example, a structure in which multiple organic layers and inorganic layers are alternately stacked. The touch layer 400 may be directly fabricated on the thin-film encapsulation layer 500 by using the thin-film encapsulation layer 500 as a substrate.

Figure 17:
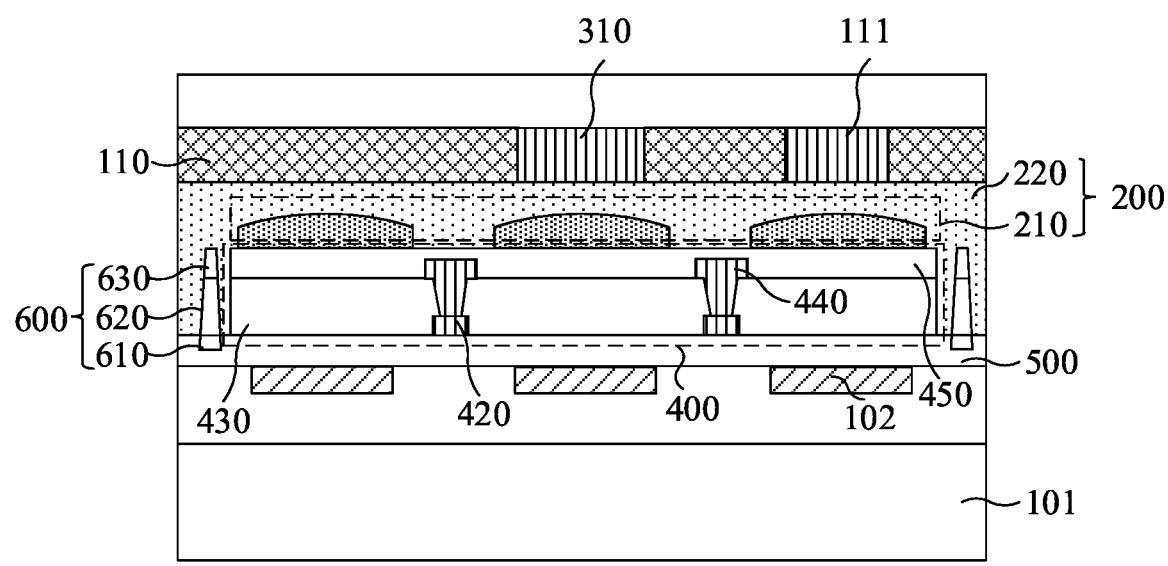
FIG. 17 is a structural view of another display panel according to an embodiment of the present disclosure.

FIG. 17 is a structural view of another display panel according to an embodiment of the present disclosure. As shown in FIG. 17, the display panel further includes a barrier 600 surrounding the multiple light-emitting elements 102, the touch layer 400 further includes an insulation layer 430, the material of the insulation layer 430 is an organic material, and part of the barrier 600 is in the same layer as the insulation layer 430. Moreover, the touch layer 400 further includes a protective layer 450, the material of the protective layer 450 is an organic material, and part of the barrier 600 is in the same layer as the protective layer 450.

It is to be noted that the display panel may include a display area and a frame area surrounding the display area, the multiple light-emitting elements 102 are located in the display area, and the barrier 600 may be located in the frame area and may surround the multiple light-emitting elements 102.

By way of example, as shown in FIG. 17, the barrier 600 includes a first sub-barrier 610, a second sub-barrier 620 and a third sub-barrier 630. The second sub-barrier 620 is in the same layer as the insulation layer 430. The third sub-barrier 630 is in the same layer as the protective layer 450.

Optionally, the barrier 600 may be embedded in the thin-film encapsulation layer 500. On the one hand, the barrier 600 prevents an organic layer from expanding outward in the thin-film encapsulation layer 500. On the other hand, the height of the entire film around the touch layer 400 is raised so that the flatness of the upper surface of the touch layer 400 and the upper surface of the surrounding area of the touch layer 400 is improved, and thus touch signal lines are not easily broken when routed on this surface. This facilitates the improvement of the reliability of the touch layer.

It is to be noted that part of the barrier 600 is disposed in the same layer as the insulation layer 430, and part of the barrier 600 is disposed in the same layer as the protective layer 450. In this manner, a separate process does not need to be provided for the part, in the barrier 600, that is in the same layer as the insulation layer 430 and the protective layer 450. This facilitates the simplification of the preparation process of the display panel.

It is to be further noted that in other implementations of this embodiment, only part of the barrier 600 is in the same layer as the insulation layer 430, or only part of the barrier 600 is in the same layer as the protective layer 450, which may be reasonably configured according to actual requirements.

Figure 18:
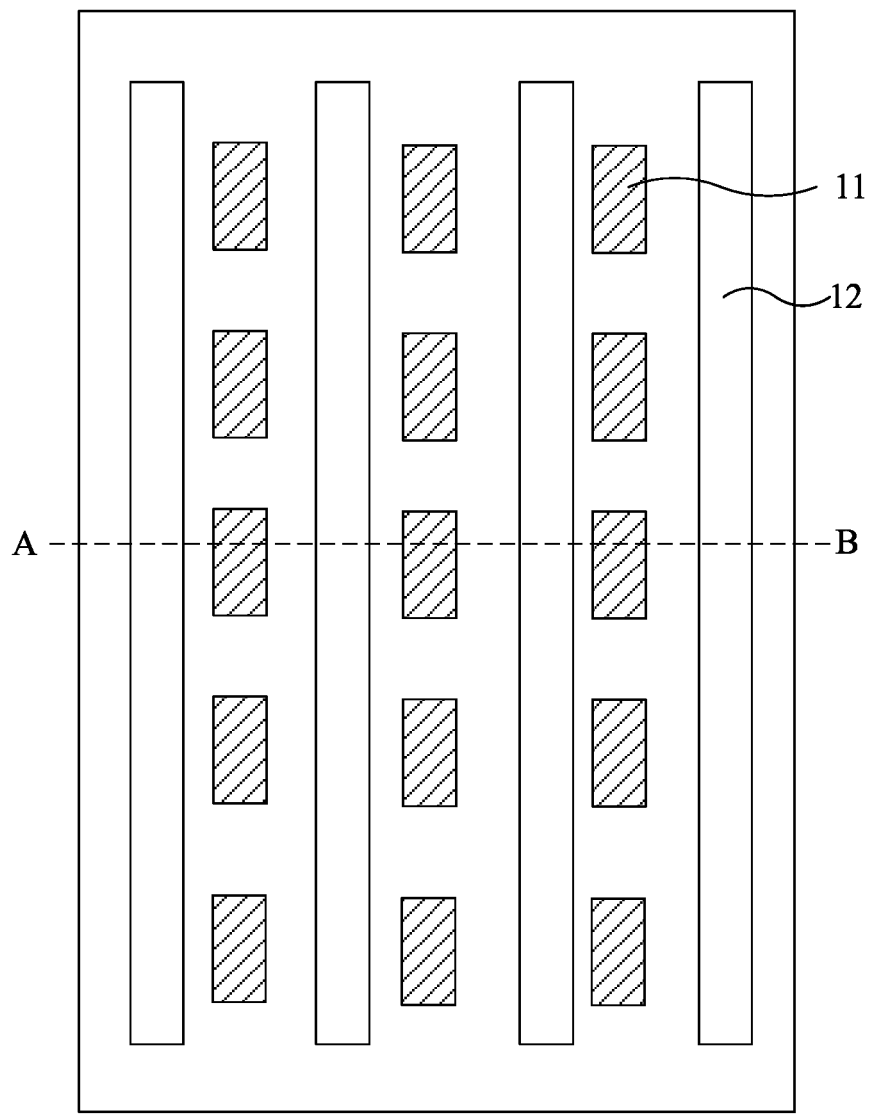
FIG. 18 is a partial top view of a display panel according to an embodiment of the present disclosure.
Figure 19:
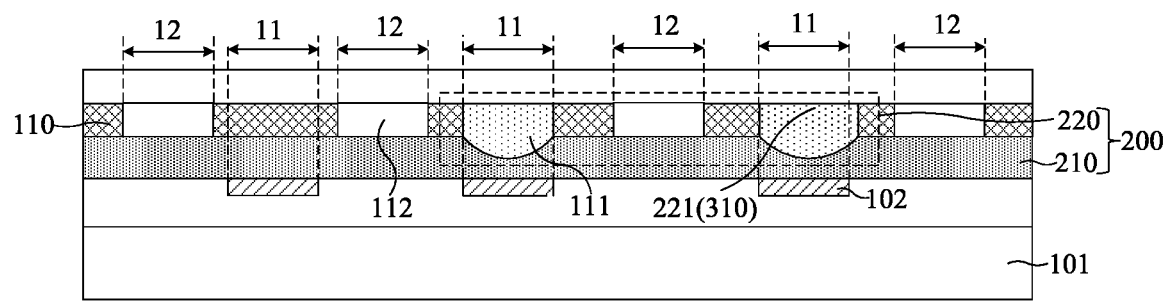
FIG. 19 is a cross-sectional view taken along the dashed line AB of FIG. 18.

FIG. 18 is a partial top view of a display panel according to an embodiment of the present disclosure. FIG. 19 is a cross-sectional view taken along the dashed line AB of FIG. 18. As shown in FIG. 18, the display panel further includes multiple light-emitting areas 11 and multiple transparent areas 12. Each light-transmitting area 12 is disposed between adjacent two multiple light-emitting areas of the multiple light-emitting areas 11. As shown in FIG. 19, each light-emitting element 102 is located in a respective light-emitting area 11. The circular polarizer 110 further includes at least one second hollow structure 112 located in the multiple transparent areas 12.

Figure 20:
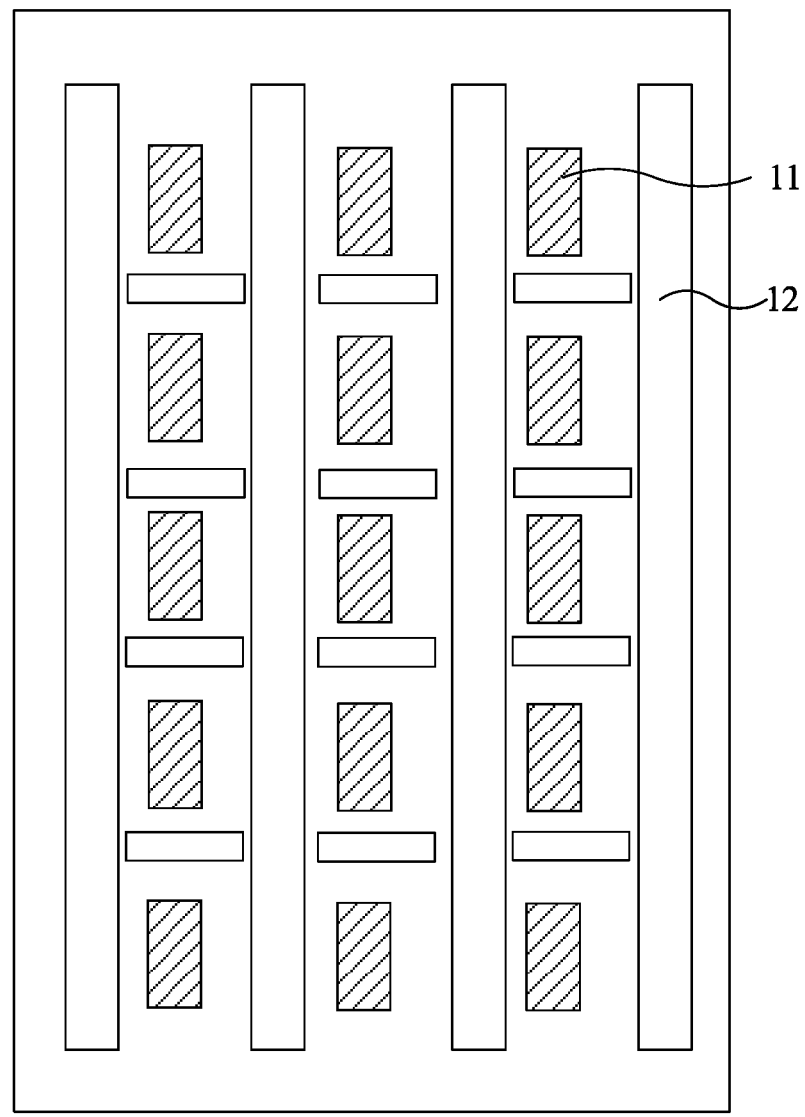
FIG. 20 is a partial top view of another display panel according to an embodiment of the present disclosure.

This embodiment does not limit the specific layout of the multiple transparent areas 12. For example, the layout shown in FIG. 20 may also be used. Specifically, the at least one second hollow structure 112 may be, for example, disposed in an reserved area for optical elements or disposed between adjacent light-emitting elements in a transparent display screen. The reserved area for optical elements is used in the disposition of optical elements such as cameras.

It is to be noted that the at least one second hollow structure 112 can increase the light transmittance of the multiple transparent areas 12, and thus enhance the transparency of the transparent display screen. Alternatively, the at least one second hollow structure 112 can provide more sufficient amount of light for the optical elements disposed in the reserved area for optical elements, and thus improve the performance of optical elements.

Figure 21:
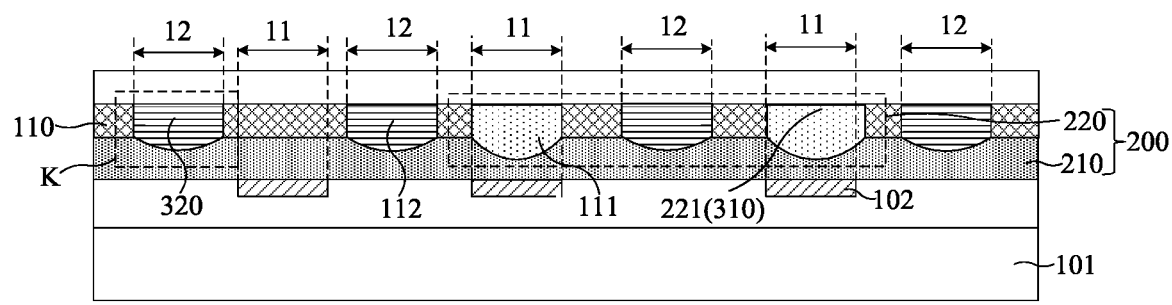
FIG. 21 is a structural view of another display panel according to an embodiment of the present disclosure.
Figure 22:
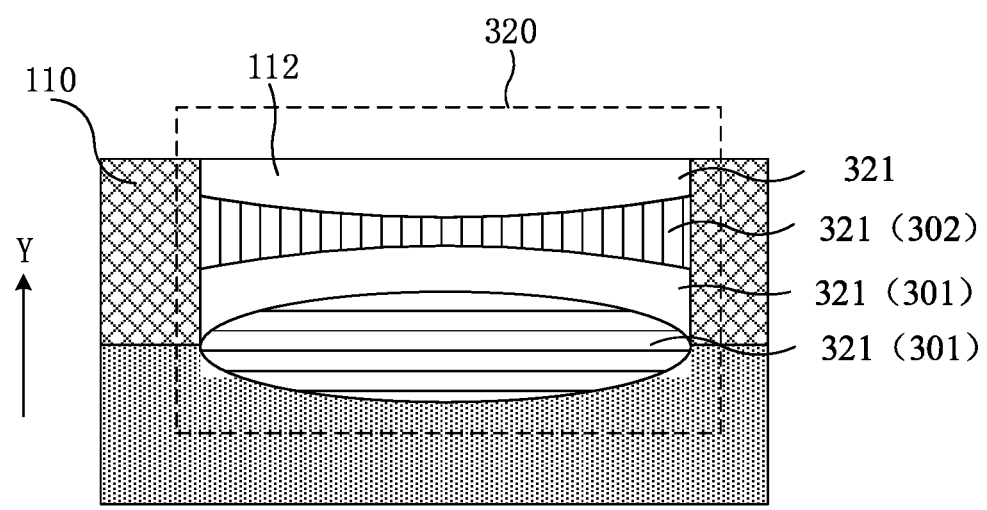
FIG. 22 is a partial enlarged view in the dashed box K of FIG. 21.

FIG. 21 is a structural view of another display panel according to an embodiment of the present disclosure. As shown in FIG. 21, the display panel further includes multiple second optical adhesive blocks 320. Each second optical adhesive block 320 corresponds to a respective one of the at least one second hollow structure 112, and each second optical adhesive block 320 fills the respective one of the at least one second hollow structure 112. FIG. 22 is a partial enlarged view in the dashed box K of FIG. 21. As shown in FIG. 22, each second optical adhesive block 320 includes multiple sub-optical adhesive blocks 321. The multiple sub-optical adhesive blocks 321 are stacked along a light outgoing direction Y of the multiple light-emitting elements. The multiple sub-optical adhesive blocks 321 include at least one first sub-optical adhesive block 301 and at least one second sub-optical adhesive block 302. Each of the at least one first sub-optical adhesive block 301 has a convex lens structure, and each of the at least one second sub-optical adhesive block 302 has a concave lens structure.

It is to be noted that the structure of a convex lens has a function of converging light, and the structure of a concave lens has a function of diverging light. In the case where the structure of a convex lens and the structure of a concave lens cooperate to achieve the adjustment of the propagation direction of light, the propagation direction of light after adjustment does not deviate too far from the light outgoing direction of the multiple light-emitting elements 102, and the adjusted light is still the effective light source of the display panel. In addition, the multiple second optical adhesive blocks 320 can fill the at least one second hollow structure 112 to enhance the strength of and the sealing performance of the circular polarizer 110. Moreover, the multiple second optical adhesive blocks 320 are formed of a material such as optical adhesive with good light transmittance. This facilitates the improvement of the light-emitting efficiency.

It is to be further noted that this embodiment does not limit the arrangement of the multiple sub-optical adhesive blocks 321 in the multiple second optical adhesive blocks 320, which may be reasonably configured according to actual requirements.

It is worth noting that the number and disposition of the multiple light-emitting elements 102 in the display panel in FIGS. 2 to 22 are only examples. This embodiment does not limit the number and disposition of the multiple light-emitting elements 102 in the display panel. By way of example, the display panel includes multiple light-emitting elements 102 arranged in a matrix. The multiple light-emitting elements 102 include red light-emitting elements, green light-emitting elements and blue light-emitting elements. Along the row direction and column direction of the matrix, the red light-emitting elements, the green light-emitting elements and the blue light-emitting elements are sequentially arranged in a cyclic manner.

Figure 23:
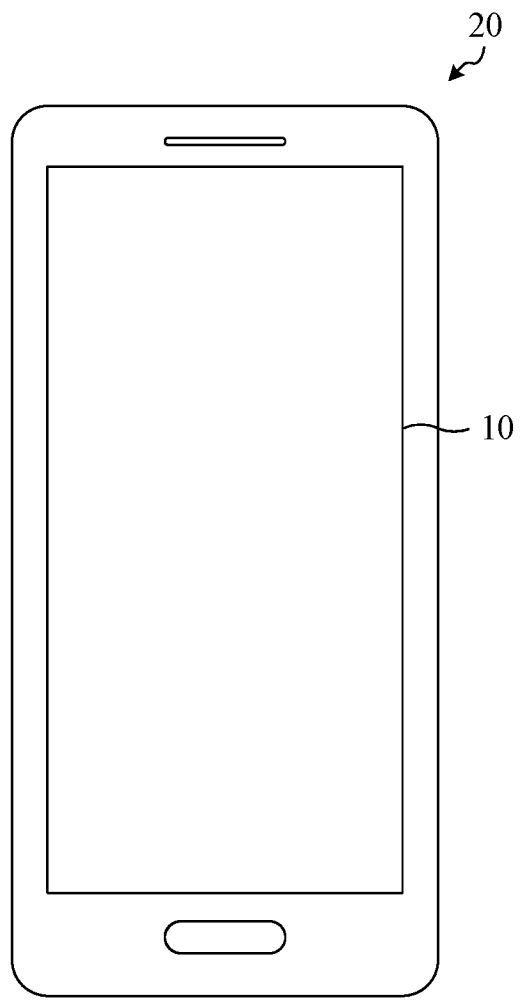
FIG. 23 is a structural view of a display device according to an embodiment of the present disclosure.

FIG. 23 is a structural view of a display device according to an embodiment of the present disclosure. As shown in FIG. 23, the display device 20 includes the display panel 10 described in any embodiment of the present disclosure. Since the display device 20 provided in this embodiment includes any display panel 10 provided in embodiments of the present disclosure, the display device 20 has same or corresponding beneficial effects as the display panel 10 included therein, and details are not described here again.

Figure 24:
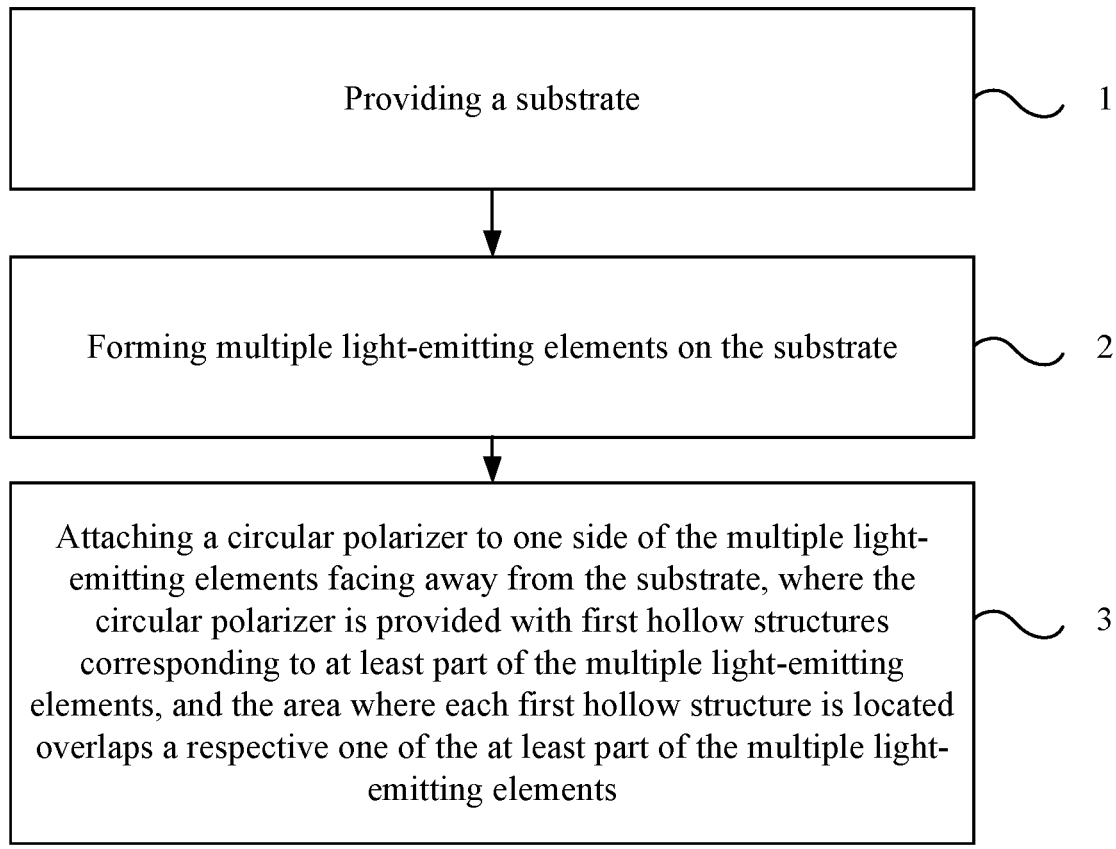
FIG. 24 is a flowchart of a manufacturing method of a display panel according to an embodiment of the present disclosure.

FIG. 24 is a flowchart of a manufacturing method of a display panel according to an embodiment of the present disclosure. This manufacturing method of a display panel is used for preparing the display panel provided in any embodiment of the present disclosure. As shown in FIG. 24, the manufacturing method of a display panel specifically includes the steps described below.

In step 1, a substrate is provided.

In step 2, multiple light-emitting elements are formed on the substrate.

In step 3, a circular polarizer is attached to one side of the multiple light-emitting elements facing away from the substrate. The circular polarizer is provided with first hollow structures corresponding to at least part of the multiple light-emitting elements. The area where each first hollow structure is located overlaps a respective one of the at least part of the multiple light-emitting elements.

In the solution provided in this embodiment, multiple light-emitting elements are formed on the substrate, a circular polarizer is disposed on one side of the multiple light-emitting elements facing away from the substrate, the circular polarizer is provided with first hollow structures corresponding to at least part of the multiple light-emitting elements, and the area where each first hollow structure is located overlaps a respective one of the at least part of the multiple light-emitting elements. In this manner, while the size of the first hollow structures is increased to satisfy the requirement for a large viewing angle, the circular polarizer with an excellent reflection reduction effect in the remaining area can still effectively reduce the reflectivity of the display panel to external light. Therefore, the requirements for both reflection reduction and a large viewing angle are satisfied.

In this embodiment, before the circular polarizer is attached to the side of the multiple light-emitting elements facing away from the substrate, the method further includes providing a cover plate; attaching the circular polarizer to the cover plate; and forming a second light adjusting layer on one side of the circular polarizer facing away from the cover plate. The second light adjusting layer includes multiple microlenses. Correspondingly, the step of attaching the circular polarizer to the side of the multiple light-emitting elements facing away from the substrate includes attaching the circular polarizer to the side of the multiple light-emitting elements facing away from the substrate by using an optical adhesive layer; and curing the optical adhesive layer to form a first light adjusting layer. The refractivity of the first light adjusting layer is less than the refractivity of the second light adjusting layer, and the first light adjusting layer and the second light adjusting layer constitute a microlens structure layer.

Figure 25:
FIGS. 25 to 39 are schematic views of manufacturing processes of display panels according to embodiments of the present disclosure.

Specifically, referring to FIG. 25, a cover plate 107 is provided.

Figure 26:
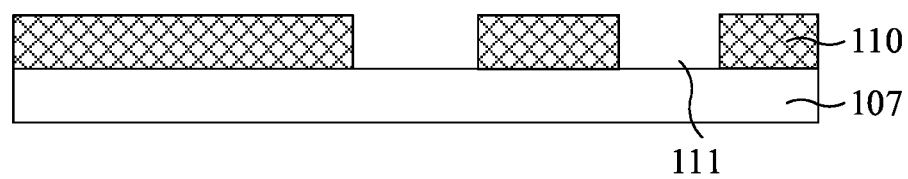

Referring to FIG. 26, a circular polarizer 110 is attached to the cover plate 107. The circular polarizer 110 includes multiple first hollow structures 111.

Figure 27:
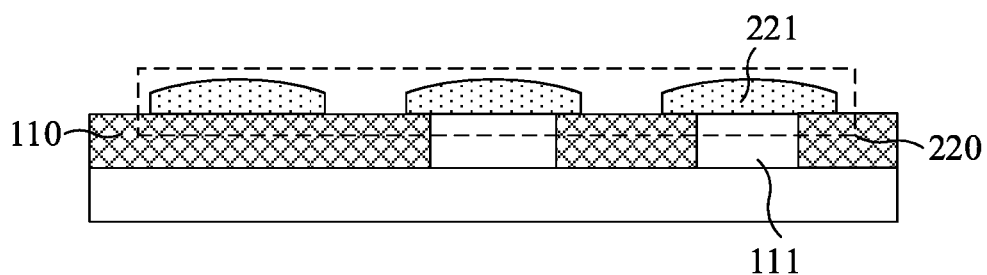

Referring to FIG. 27, a second light adjusting layer 220 is formed on one side of the circular polarizer 110 facing away from the cover plate 107. The second light adjusting layer 220 includes multiple microlenses 221.

It is to be understood that to make the multiple microlenses 221 overlapping the multiple first hollow structures 111 have a flat deposition surface, the multiple first hollow structures 111 are filled by using color resistance blocks or optical adhesive blocks before the second light adjusting layer 220 is formed.

Figure 28:

Referring to FIG. 28, a substrate 101 is provided.

Figure 29:
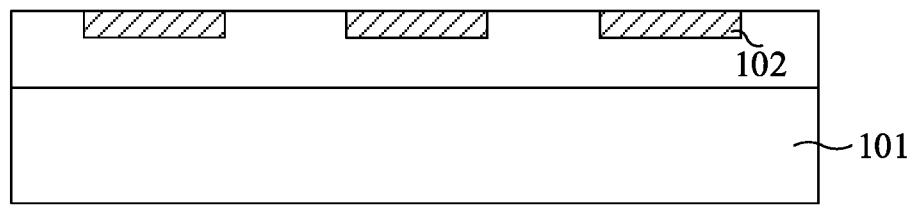

Referring to FIG. 29, multiple light-emitting elements 102 are formed on the substrate 101.

Then, a circular polarizer 110 is attached to one side of the multiple light-emitting elements 102 facing away from the substrate 101 by using an optical adhesive layer. The area where each first hollow structure 111 is located in the circular polarizer 110 overlaps a respective light-emitting element 102. The optical adhesive layer is cured to form a first light adjusting layer 210. The refractivity of the first light adjusting layer 210 is less than the refractivity of the second light adjusting layer 220. The first light adjusting layer 210 and the second light adjusting layer 220 constitute a microlens structure layer 200, and thus the display panel shown in FIG. 10 is obtained.

In another implementation of this embodiment, after the multiple light-emitting elements are formed on the substrate, the method further includes forming a touch layer on the side of the multiple light-emitting elements facing away from the substrate, where the touch layer includes a protective layer disposed on one side facing away from the substrate; and forming a first light adjusting layer on the protective layer, where the first light adjusting layer includes multiple microlenses. Correspondingly, the step of attaching the circular polarizer to the side of the multiple light-emitting elements facing away from the substrate may include providing a cover plate; attaching the circular polarizer to the cover plate; enabling a surface of one side of the circular polarizer facing away from the cover to be opposite to the first light adjusting layer, and attaching the circular polarizer to one side of the first light adjusting layer facing away from the substrate by using an optical adhesive layer; and curing the optical adhesive layer to form a second light adjusting layer. The refractivity of the second light adjusting layer is greater than the refractivity of the first light adjusting layer, and the second light adjusting layer and the first light adjusting layer constitute a microlens structure layer.

Specifically, referring to FIG. 28, a substrate 101 is provided.

Referring to FIG. 29, multiple light-emitting elements 102 are formed on the substrate 101.

Figure 30:
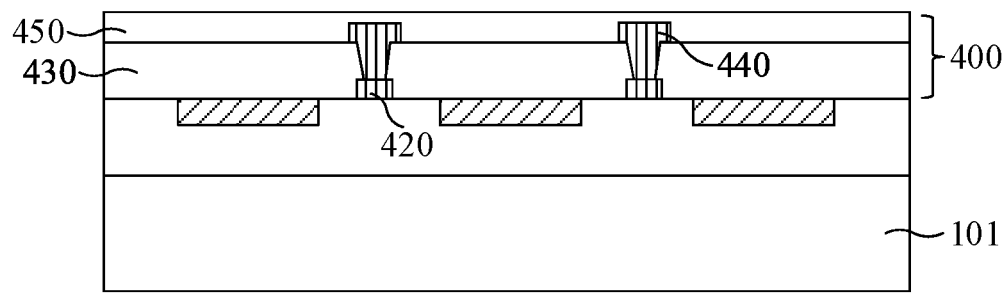

Referring to FIG. 30, a touch layer 400 is formed on one side of the multiple light-emitting elements 102 facing away from the substrate 101. The touch layer 400 includes a protective layer 450 disposed on one side facing away from the substrate 101.

Figure 31:
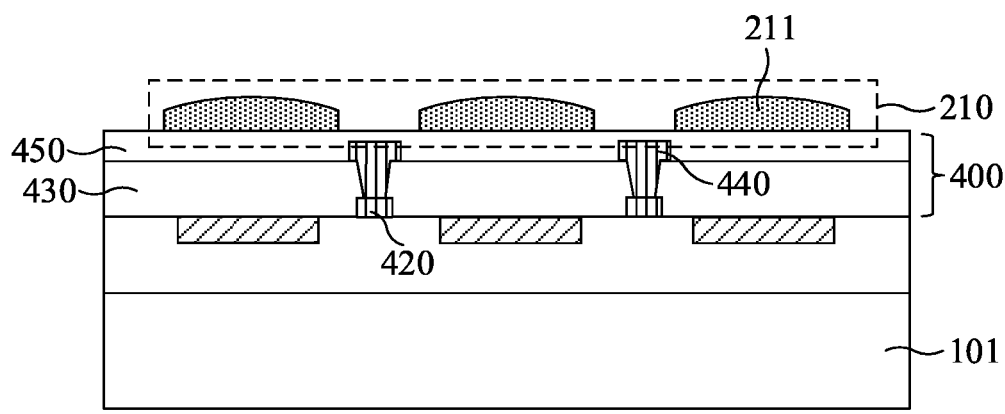

Referring to FIG. 31, a first light adjusting layer 210 is formed on the protective layer 450. The first light adjusting layer 210 includes multiple microlenses 211.

Referring to FIG. 25, a cover plate 107 is provided.

Referring to FIG. 26, a circular polarizer 110 is attached to the cover plate 107. The circular polarizer 110 includes multiple first hollow structures 111.

By way of example, after the circular polarizer 110 is attached to the cover plate 107, color resistance blocks may fill the multiple first hollow structures 111.

Then, a surface of one side of the circular polarizer 110 facing away from the cover plate 107 is enabled to be opposite to a first light adjusting layer 210, the circular polarizer 110 is attached to one side of the first light adjusting layer 210 facing away from the substrate 101 by using an optical adhesive layer, and the optical adhesive layer is cured so that a second light adjusting layer 220 is formed. The refractivity of the second light adjusting layer 220 is greater than the refractivity of the first light adjusting layer 210. The second light adjusting layer 220 and the first light adjusting layer 210 constitute a microlens structure layer, and then the display panel shown in FIG. 15 is obtained.

Optionally, the circular polarizer further includes multiple second hollow structures. The display panel further includes multiple light-emitting areas and multiple transparent areas. Each light-transmitting area is located between adjacent ones of the multiple light-emitting areas. Each light-emitting element is located in a respective light-emitting area. The multiple second hollow structures are located in the multiple transparent areas. After the circular polarizer is attached to the cover, the method further includes forming second optical adhesive blocks in the multiple second hollow structures. Each second optical adhesive block includes multiple sub-optical adhesive blocks. The multiple sub-optical adhesive blocks are stacked along a light outgoing direction of the multiple light-emitting elements. The multiple sub-optical adhesive blocks include at least one first sub-optical adhesive block and at least one second sub-optical adhesive block. Each of the at least one first sub-optical adhesive block has a convex lens structure, and each of the at least one second sub-optical adhesive block has a concave lens structure.

The case where the multiple second optical adhesive blocks include four sub-optical adhesive blocks, and the four sub-optical adhesive blocks are one first sub-optical adhesive block, one first sub-optical adhesive block, one second sub-optical adhesive block and one conventional sub-optical adhesive block which are sequentially stacked on the cover plate is used as an example below to describe the specific manufacturing process of the multiple second optical adhesive blocks.

Figure 32:
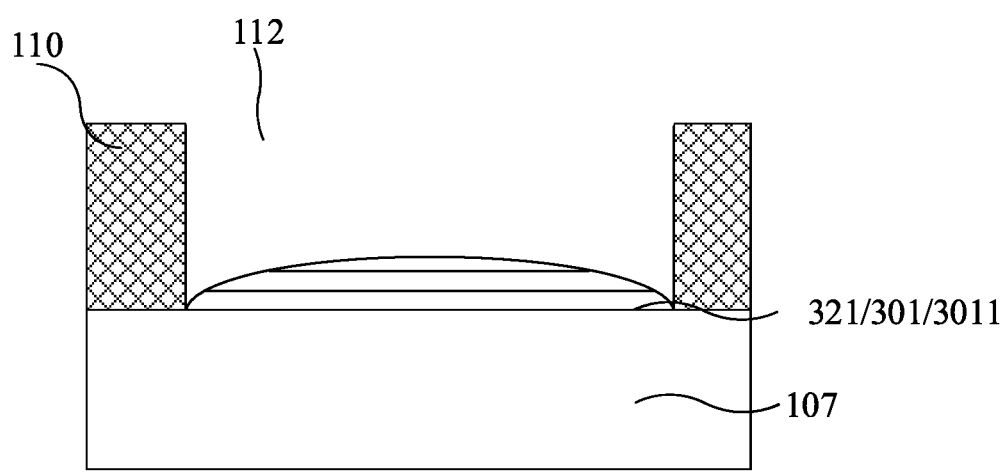

Specifically, as shown in FIG. 32, in each second hollow structure 112, the first sub-optical adhesive block 3011 is formed by using optical adhesive to which a hydrophobic agent is added.

Figure 33:
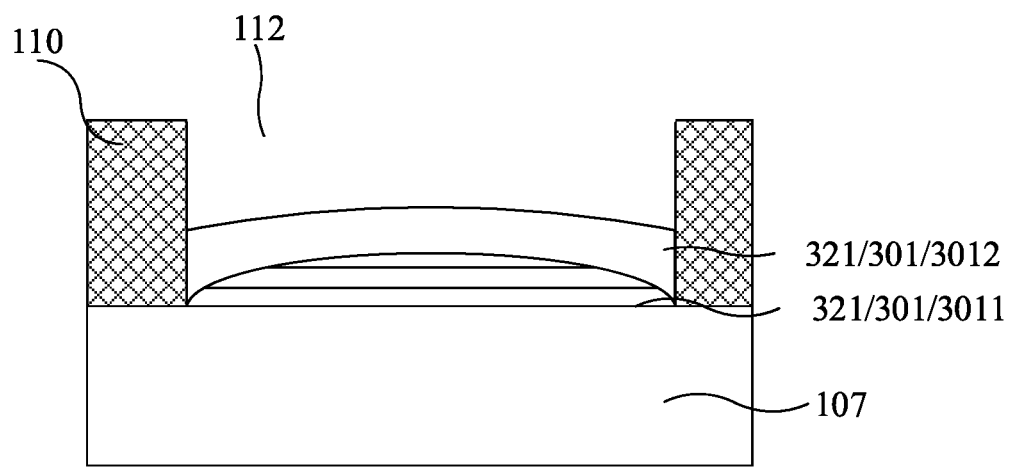

As shown in FIG. 33, the second first sub-optical adhesive block 3012 is formed on the second first sub-optical adhesive block by using optical adhesive to which a hydrophobic agent is added.

Figure 34:
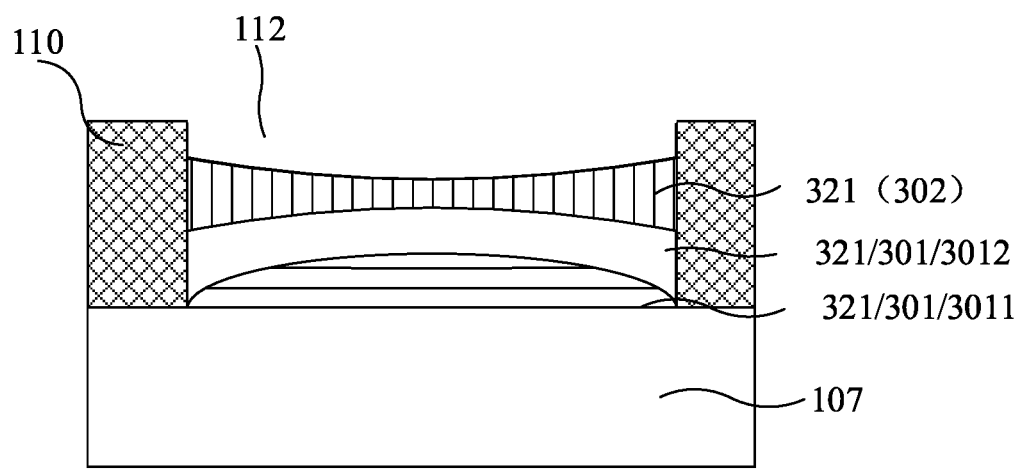

As shown in FIG. 34, the second sub-optical adhesive block 302 is formed on the second first sub-optical adhesive block by using optical adhesive to which a hydrophilic agent is added.

Figure 35:
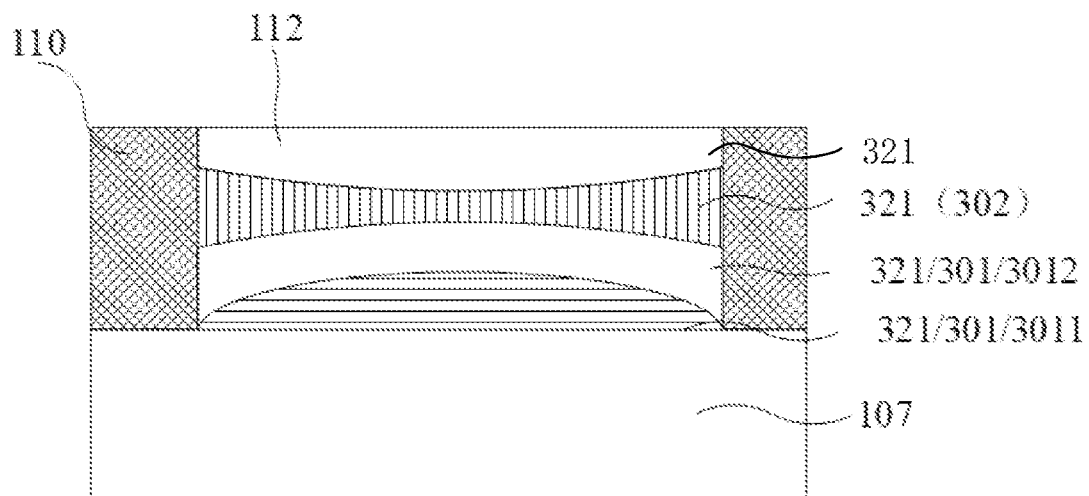

As shown in FIG. 35, the conventional sub-optical adhesive block 321 is formed on the second sub-optical adhesive block 302 by using optical adhesive to which a hydrophobic agent and a hydrophilic agent are not added.

In another implementation of this embodiment, the step of attaching a circular polarizer to one side of multiple light-emitting elements facing away from a substrate includes attaching the circular polarizer to the side of the multiple light-emitting elements facing away from the substrate by using an optical adhesive layer, curing the optical adhesive layer to form a first light adjusting layer, patterning the first light adjusting layer exposed in first hollow structures, and forming color resistance blocks in the first hollow structures on the patterned first light adjusting layer. The color resistance blocks are multiplexed as multiple microlenses. The multiple microlenses constitute a second light adjusting layer. The refractivity of the second light adjusting layer is greater than the refractivity of the first light adjusting layer. The second light adjusting layer and the first light adjusting layer constitute a microlens structure layer.

Specifically, referring to FIG. 28, a substrate 101 is provided.

Referring to FIG. 29, multiple light-emitting elements 102 are formed on the substrate 101.

Figure 36:
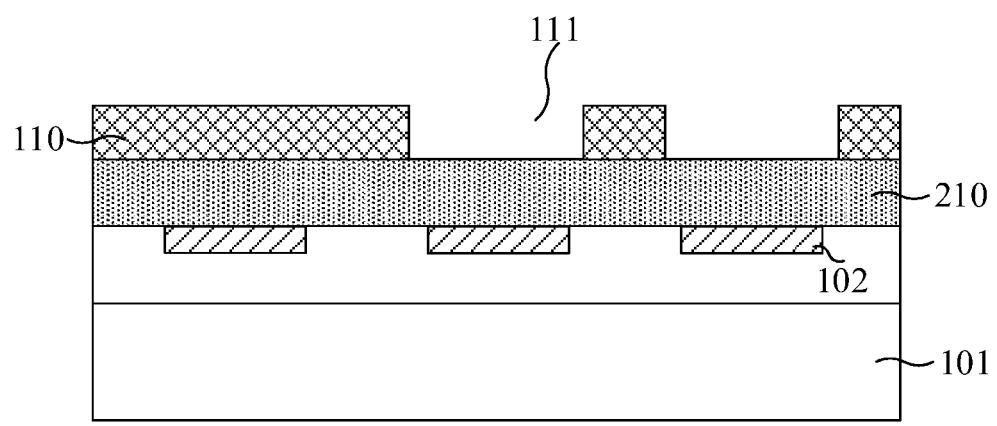

Referring to FIG. 36, a circular polarizer 110 is attached to one side of the multiple light-emitting elements 102 facing away from the substrate 101 by using an optical adhesive layer, and the optical adhesive layer is cured to form a first light adjusting layer 210.

Figure 37:
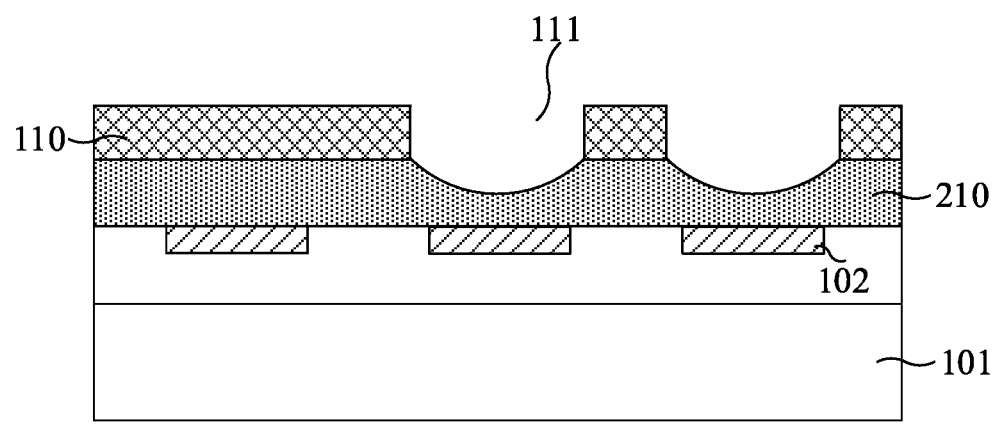

Referring to FIG. 37, the first light adjusting layer 210 exposed in first hollow structures 111 is patterned.

Then, color resistance blocks 310 are formed in the first hollow structures 111 on the patterned first light adjusting layer 210. The color resistance blocks 310 are multiplexed as microlenses 221. The multiple microlenses 221 constitute a second light adjusting layer 220. The refractivity of the second light adjusting layer 220 is greater than the refractivity of the first light adjusting layer 210. The second light adjusting layer 220 and the first light adjusting layer 210 constitute a microlens structure layer 200, and then a cover is attached so that the display panel shown in FIG. 6 is obtained.

Optionally, the circular polarizer further includes multiple second hollow structures. The display panel further includes multiple light-emitting areas and multiple transparent areas. Each light-transmitting area is located between adjacent ones of the multiple light-emitting areas. Each light-emitting element is located in a respective light-emitting area. The multiple second hollow structures are located in the multiple transparent areas. After the optical adhesive layer is cured so that the first light adjusting layer is formed, the method further includes patterning the first light adjusting layer exposed in the multiple second hollow structures, and forming second optical adhesive blocks in the multiple second hollow structures on the patterned first light adjusting layer. Each second optical adhesive block includes multiple sub-optical adhesive blocks. The multiple sub-optical adhesive blocks are stacked along a light outgoing direction of the multiple light-emitting elements. The multiple sub-optical adhesive blocks include at least one first sub-optical adhesive block and at least one second sub-optical adhesive block. Each of the at least one first sub-optical adhesive block has a convex lens structure, and each of the at least one second sub-optical adhesive block has a concave lens structure.

Specifically, referring to FIG. 28, a substrate 101 is provided.

Referring to FIG. 29, multiple light-emitting elements 102 are formed on the substrate 101.

Figure 38:
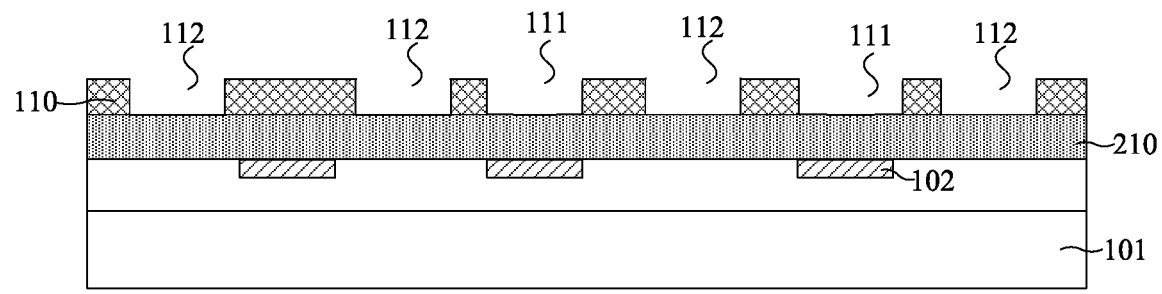

Referring to FIG. 38, a circular polarizer 110 is attached to one side of the multiple light-emitting elements 102 facing away from the substrate 101 by using an optical adhesive layer, and the optical adhesive layer is cured to form a first light adjusting layer 210. The circular polarizer 110 includes first hollow structures 111 and second hollow structures 112.

Figure 39:
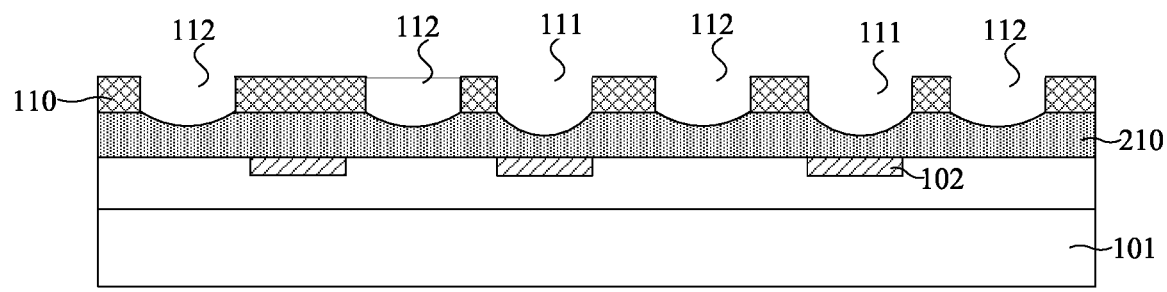

Referring to FIG. 39, a first light adjusting layer 210 exposed in the first hollow structures 111 is patterned, and the first light adjusting layer 210 exposed in the second hollow structures 112 is patterned.

Then, color resistance blocks 310 are formed in the first hollow structures 111 on the patterned first light adjusting layer 210. The color resistance blocks 310 are multiplexed as microlenses 221. The multiple microlenses 221 constitute a second light adjusting layer 220. The refractivity of the second light adjusting layer 220 is greater than the refractivity of the first light adjusting layer 210. The second light adjusting layer 220 and the first light adjusting layer 210 constitute a microlens structure layer 200. Second optical adhesive blocks 320 are formed in the second hollow structures 112 on the patterned first light adjusting layer 210. Each second optical adhesive blocks includes multiple sub-optical adhesive blocks. The multiple sub-optical adhesive blocks are stacked along a light outgoing direction of the multiple light-emitting elements. The multiple sub-optical adhesive blocks include at least one first sub-optical adhesive block and at least one second sub-optical adhesive block. Each of the at least one first sub-optical adhesive block has a convex lens structure, and each of the at least one second sub-optical adhesive block has a concave lens structure, and then a cover is attached so that the display panel shown in FIG. 21 is obtained.

Optionally, the second optical adhesive blocks in the second hollow structures 112 may be formed according to the manufacturing methods provided in FIGS. 32 to 35, and details are not described here again.

In another implementation of this embodiment, the step of attaching a circular polarizer to one side of multiple light-emitting elements facing away from a substrate may include attaching the circular polarizer to the side of the multiple light-emitting elements facing away from the substrate by using an optical adhesive layer to which a hydrophilic agent or a hydrophobic agent is added, curing the optical adhesive layer to form a first light adjusting layer, and forming color resistance blocks in first hollow structures on the first light adjusting layer. The color resistance blocks are multiplexed as multiple microlenses. The multiple microlenses constitute a second light adjusting layer. The refractivity of the second light adjusting layer is greater than the refractivity of the first light adjusting layer. The second light adjusting layer and the first light adjusting layer constitute a microlens structure layer.

Specifically, referring to FIG. 28, a substrate 101 is provided.

Referring to FIG. 29, multiple light-emitting elements 102 are formed on the substrate 101.

A circular polarizer 110 is attached to one side of the multiple light-emitting elements 102 facing away from the substrate 101 by using an optical adhesive layer to which a hydrophilic agent is added, and the optical adhesive layer is cured to form a first light adjusting layer 210 so that the structure shown in FIG. 37 is obtained.

Then, color resistance blocks 310 are formed in first hollow structures 111 on the first light adjusting layer 210. The color resistance blocks 310 are multiplexed as multiple microlenses 221. The multiple microlenses 221 constitute a second light adjusting layer 220. The refractivity of the second light adjusting layer 220 is greater than the refractivity of the first light adjusting layer 210. The second light adjusting layer 220 and the first light adjusting layer 210 constitute a microlens structure layer 200, and then a cover is attached so that the display panel shown in FIG. 6 is obtained.

Optionally, the circular polarizer further includes multiple second hollow structures. The display panel further includes multiple light-emitting areas and multiple transparent areas. Each light-transmitting area is located between adjacent ones of the multiple light-emitting areas. Each light-emitting element is located in a respective light-emitting area. The multiple second hollow structures are located in the multiple transparent areas. After the color resistance blocks are formed in the first hollow structures on the first light adjusting layer, the method further includes forming second optical adhesive blocks in the multiple second hollow structures on the first light adjusting layer. Each second optical adhesive block includes multiple sub-optical adhesive blocks. The multiple sub-optical adhesive blocks are stacked along a light outgoing direction of the multiple light-emitting elements. The multiple sub-optical adhesive blocks include at least one first sub-optical adhesive block and at least one second sub-optical adhesive block. Each of the at least one first sub-optical adhesive block has a convex lens structure, and each of the at least one second sub-optical adhesive block has a concave lens structure.

Specifically, referring to FIG. 28, a substrate 101 is provided.

Referring to FIG. 29, multiple light-emitting elements 102 are formed on the substrate 101.

A circular polarizer 110 is attached to one side of the multiple light-emitting elements 102 facing away from the substrate 101 by using an optical adhesive layer to which a hydrophilic agent is added, and the optical adhesive layer is cured to form a first light adjusting layer 210 so that the structure shown in FIG. 39 is obtained. The circular polarizer 110 includes first hollow structures 111 and second hollow structures 112.

Then, color resistance blocks 310 are formed in the first hollow structures 111 on the first light adjusting layer 210. The color resistance blocks 310 are multiplexed as multiple microlenses 221. The multiple microlenses 221 constitute a second light adjusting layer 220. The refractivity of the second light adjusting layer 220 is greater than the refractivity of the first light adjusting layer 210. The second light adjusting layer 220 and the first light adjusting layer 210 constitute a microlens structure layer 200. Second optical adhesive blocks 320 are formed in the second hollow structures 112 on the first light adjusting layer 210. Each second optical adhesive block includes multiple sub-optical adhesive blocks. The multiple sub-optical adhesive blocks are stacked along a light outgoing direction of the multiple light-emitting elements. The multiple sub-optical adhesive blocks include at least one first sub-optical adhesive block and at least one second sub-optical adhesive block. Each of the at least one first sub-optical adhesive block has a convex lens structure, and each of the at least one second sub-optical adhesive block has a concave lens structure, and then a cover is attached so that the display panel shown in FIG. 21 is obtained.

Optionally, the second optical adhesive blocks in the second hollow structures 112 may be formed according to the manufacturing methods provided in FIGS. 32 to 35, and details are not described here again.

It is to be noted that before being cured, the optical adhesive layer to which a hydrophilic agent is added may directly form a convex surface toward the side of the multiple light-emitting elements 102 at the positions corresponding to the first hollow structures 111 and the second hollow structures 112 so that manners such as etching do not need to be used for patterning the first light adjusting layer 210, the preparation process is simple, and the preparation cost is low. It is to be understood that in other implementations of this embodiment, a hydrophobic agent may also be added to the optical adhesive layer so that a convex surface toward one side facing away from the multiple light-emitting elements 102 is directly formed at the positions corresponding to the first hollow structures 111 and the second hollow structures 112. The specific addition of a hydrophilic agent and a hydrophobic agent may be configured according to actual requirements.

It is to be noted that the above are merely preferred embodiments of the present disclosure and the technical principles used therein. It is to be understood by those skilled in the art that the present disclosure is not limited to the embodiments described herein. Those skilled in the art can make various apparent modifications, adaptations, combinations and substitutions without departing from the scope of the present disclosure. Therefore, while the present disclosure has been described in detail through the preceding embodiments, the present disclosure is not limited to the preceding embodiments and may further include more other equivalent embodiments without departing from the concept of the present disclosure. The scope of the present disclosure is determined by the scope of the appended claims.

What is claimed is:

1. A display panel, comprising:
a substrate;
a plurality of light-emitting elements disposed on one side of the substrate; and
a circular polarizer disposed on one side of the plurality of light-emitting elements facing away from the substrate, wherein the circular polarizer is provided with first hollow structures corresponding to at least part of the plurality of light-emitting elements, and an area where each of the first hollow structures is located overlaps a respective one of the at least part of the plurality of light-emitting elements.

2. The display panel of claim 1, further comprising a microlens structure layer disposed on the side of the plurality of light-emitting elements facing away from the substrate, wherein the microlens structure layer comprises a first light adjusting layer and a second light adjusting layer, the first light adjusting layer is disposed on one side of the second light adjusting layer facing towards the substrate, and a refractivity of the first light adjusting layer is less than a refractivity of the second light adjusting layer; and
wherein at least the first light adjusting layer is located between the circular polarizer and the plurality of light-emitting elements.

3. The display panel of claim 2, wherein one of the first light adjusting layer and the second light adjusting layer is a microlens layer, and the other of the first light adjusting layer and the second light adjusting layer is an optical adhesive layer; and
the microlens layer comprises a plurality of microlenses.

4. The display panel of claim 2, wherein the second light adjusting layer comprises a plurality of microlenses, each of the plurality of microlenses corresponds to a respective one of the first hollow structures, and each of the plurality of microlenses is embedded in the respective one of the first hollow structures.

5. The display panel of claim 4, further comprising a plurality of color resistance blocks, wherein the plurality of color resistance blocks are multiplexed as the plurality of microlenses.

6. The display panel of claim 5, wherein the plurality of light-emitting elements comprise a plurality of first light-emitting elements, a plurality of second light-emitting elements and a plurality of third light-emitting elements; and a color of the plurality of first light-emitting elements is blue, a color of the plurality of second light-emitting elements is green, and a color of the plurality of third light-emitting elements is red; and
the first hollow structures are disposed in one-to-one correspondence with the plurality of first light-emitting elements, and the plurality of color resistance blocks comprise blue color resistance blocks disposed in one-to-one correspondence with the plurality of first light-emitting elements.

7. The display panel of claim 5, wherein the plurality of light-emitting elements comprise a plurality of first light-emitting elements, a plurality of second light-emitting elements and a plurality of third light-emitting elements; and a color of the plurality of first light-emitting elements is blue, a color of the plurality of second light-emitting elements is green, and a color of the plurality of third light-emitting elements is red; and
the first hollow structures are disposed in one-to-one correspondence with the plurality of first light-emitting elements, the plurality of second light-emitting elements and the plurality of third light-emitting elements, and the plurality of color resistance blocks comprise blue color resistance blocks disposed in one-to-one correspondence with the plurality of first light-emitting elements, green color resistance blocks disposed in one-to-one correspondence with the plurality of second light-emitting elements and red color resistance blocks disposed in one-to-one correspondence with the plurality of third light-emitting elements.

8. The display panel of claim 5, further comprising a plurality of first optical adhesive blocks, wherein each of the plurality of first optical adhesive blocks corresponds to a respective one of the plurality of color resistance blocks, each of the plurality of first optical adhesive blocks and the respective one of the plurality of color resistance blocks are embedded in a same first hollow structure, and each of the plurality of first optical adhesive blocks is disposed on one side of the respective one of the plurality of color resistance blocks facing away from the substrate.

9. The display panel of claim 2, wherein the second light adjusting layer is disposed between the circular polarizer and the plurality of light-emitting elements.

10. The display panel of claim 9, further comprising a plurality of color resistance blocks, wherein each of the plurality of color resistance blocks corresponds to a respective one of the first hollow structures, and each of the plurality of color resistance blocks is embedded in the respective one of the first hollow structures.

11. The display panel of claim 2, further comprising a touch layer, wherein the touch layer is located between the microlens structure layer and the plurality of light-emitting elements; and the first light adjusting layer is disposed on one side of the touch layer facing away from the substrate and is disposed adjacent to the touch layer.

12. The display panel of claim 11, wherein the touch layer further comprises a protective layer and the protective layer is disposed adjacent to the first light adjusting layer; and wherein the first light adjusting layer comprises a plurality of microlenses.

13. The display panel of claim 11, further comprising a thin-film encapsulation layer and a barrier surrounding the plurality of light-emitting elements, wherein the thin-film encapsulation layer is disposed between the plurality of light-emitting elements and the touch layer and the plurality of light-emitting elements are covered by the thin-film encapsulation layer, and the thin-film encapsulation layer is disposed adjacent to the touch layer;
wherein the touch layer further comprises an insulation layer, a material of the insulation layer is an organic material, and at least part of the barrier is disposed in a same layer as the insulation layer; or the touch layer further comprises a protective layer, a material of the protective layer is an organic material, and at least part of the barrier is disposed in a same layer as the protective layer.

14. The display panel of claim 2, further comprising a plurality of light-emitting areas, a plurality of transparent areas, and a plurality of second optical adhesive blocks; wherein each of the plurality of transparent areas is located between adjacent two light-emitting areas of the plurality of light-emitting areas;
   each of the plurality of light-emitting elements is disposed in a respective one of the plurality of light-emitting areas;
   the circular polarizer further comprises at least one second hollow structure disposed in the plurality of transparent areas; and
   wherein each of the plurality of second optical adhesive blocks corresponds to a respective one of the at least one second hollow structure, and each of the plurality of second optical adhesive blocks fills the respective one of the at least one second hollow structure; each of the plurality of second optical adhesive blocks comprises a plurality of sub-optical adhesive blocks, and the plurality of sub-optical adhesive blocks are stacked along a light outgoing direction of the plurality of light-emitting elements; and the plurality of sub-optical adhesive blocks comprise at least one first sub-optical adhesive block and at least one second sub-optical adhesive block, each of the at least one first sub-optical adhesive block has a convex lens structure, and each of the at least one second sub-optical adhesive block has a concave lens structure.

15. A display device, comprising a display panel, wherein the display panel comprises:
   a substrate;
   a plurality of light-emitting elements disposed on one side of the substrate; and
   a circular polarizer disposed on one side of the plurality of light-emitting elements facing away from the substrate, wherein the circular polarizer is provided with first hollow structures corresponding to at least part of the plurality of light-emitting elements, and an area where each of the first hollow structures is located overlaps a respective one of the at least part of the plurality of light-emitting elements.

16. A manufacturing method of a display panel, comprising:
   providing a substrate;
   forming a plurality of light-emitting elements on the substrate; and
   attaching a circular polarizer to one side of the plurality of light-emitting elements facing away from the substrate, wherein the circular polarizer is provided with first hollow structures corresponding to at least part of the plurality of light-emitting elements, and an area where each of the first hollow structures is located overlaps a respective one of the at least part of the plurality of light-emitting elements.

17. The manufacturing method of claim 16, wherein before the attaching the circular polarizer to the side of the plurality of light-emitting elements facing away from the substrate, the method further comprises:
   providing a cover plate;
   attaching the circular polarizer to the cover plate; and
   forming a second light adjusting layer on one side of the circular polarizer facing away from the cover, wherein the second light adjusting layer comprises a plurality of microlenses; and
   wherein the attaching the circular polarizer to the side of the plurality of light-emitting elements facing away from the substrate comprises:
   attaching the circular polarizer to the side of the plurality of light-emitting elements facing away from the substrate by using an optical adhesive layer; and
   curing the optical adhesive layer to form a first light adjusting layer, wherein a refractivity of the first light adjusting layer is less than a refractivity of the second light adjusting layer, and the first light adjusting layer and the second light adjusting layer constitute a microlens structure layer.

18. The manufacturing method of claim 16, wherein after forming the plurality of light-emitting elements on the substrate, the method further comprises:
   forming a touch layer on the side of the plurality of light-emitting elements facing away from the substrate, wherein the touch layer comprises a protective layer disposed on one side facing away from the substrate; and
   forming a first light adjusting layer on the protective layer, wherein the first light adjusting layer comprises a plurality of microlenses; and
   wherein the attaching the circular polarizer to the side of the plurality of light-emitting elements facing away from the substrate comprises:
   providing a cover plate;
   attaching the circular polarizer to the cover plate;
   enabling a surface of one side of the circular polarizer facing away from the cover to be opposite to the first light adjusting layer, and attaching the circular polarizer to one side of the first light adjusting layer facing away from the substrate by using an optical adhesive layer; and
   curing the optical adhesive layer to form a second light adjusting layer, wherein a refractivity of the second light adjusting layer is greater than a refractivity of the first light adjusting layer, and the second light adjusting layer and the first light adjusting layer constitute a microlens structure layer.

19. The manufacturing method of claim 16, wherein the attaching the circular polarizer to the side of the plurality of light-emitting elements facing away from the substrate comprises:
   attaching the circular polarizer to the side of the plurality of light-emitting elements facing away from the substrate by using an optical adhesive layer;
   curing the optical adhesive layer to form a first light adjusting layer;
   patterning the first light adjusting layer exposed in the first hollow structures; and
   forming color resistance blocks in the first hollow structures on the patterned first light adjusting layer, wherein the color resistance blocks are multiplexed as a plurality of microlenses, the plurality of microlenses constitute a second light adjusting layer, a refractivity of the second light adjusting layer is greater than a refractivity of the first light adjusting layer, and the second light adjusting layer and the first light adjusting layer constitute a microlens structure layer.

20. The manufacturing method of claim 16, wherein the attaching the circular polarizer to the side of the plurality of light-emitting elements facing away from the substrate comprises:

attaching the circular polarizer to the side of the plurality of light-emitting elements facing away from the substrate by using an optical adhesive layer to which a hydrophilic agent or a hydrophobic agent is added;
curing the optical adhesive layer to form a first light adjusting layer; and
forming color resistance blocks in the first hollow structures on the first light adjusting layer, wherein the color resistance blocks are multiplexed as a plurality of microlenses, the plurality of microlenses constitute a second light adjusting layer, a refractivity of the second light adjusting layer is greater than a refractivity of the first light adjusting layer, and the second light adjusting layer and the first light adjusting layer constitute a microlens structure layer.

* * * * *